(12) United States Patent
Kim et al.

(10) Patent No.: US 10,128,346 B2
(45) Date of Patent: Nov. 13, 2018

(54) SEMICONDUCTOR DEVICE

(71) Applicant: SAMSUNG ELECTRONICS CO., LTD., Suwon-si, Gyeonggi-do (KR)

(72) Inventors: Ho-Jun Kim, Suwon-si (KR); Sung-Dae Suk, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 71 days.

(21) Appl. No.: 15/165,145

(22) Filed: May 26, 2016

(65) Prior Publication Data

US 2017/0092730 A1    Mar. 30, 2017

(30) Foreign Application Priority Data

Sep. 30, 2015    (KR) .................... 10-2015-0137683

(51) Int. Cl.
| | | |
|---|---|---|
| *H01L 29/423* | (2006.01) | |
| *H01L 29/51* | (2006.01) | |
| *H01L 29/786* | (2006.01) | |
| *B82Y 10/00* | (2011.01) | |
| *H01L 29/66* | (2006.01) | |
| *H01L 29/775* | (2006.01) | |
| *H01L 29/06* | (2006.01) | |

(52) U.S. Cl.
CPC ........ *H01L 29/42392* (2013.01); *B82Y 10/00* (2013.01); *H01L 29/0673* (2013.01); *H01L 29/42364* (2013.01); *H01L 29/51* (2013.01); *H01L 29/66439* (2013.01); *H01L 29/775* (2013.01); *H01L 29/78645* (2013.01)

(58) Field of Classification Search
CPC ............. H01L 29/42392; H01L 29/51; H01L 29/78645; H01L 29/6656; H01L 2029/7858; H01L 2029/42392; H01L 2029/0665–2029/068; H01L 2029/0673
See application file for complete search history.

(56) References Cited

U.S. PATENT DOCUMENTS

| | | | |
|---|---|---|---|
| 7,642,578 B2 * | 1/2010 | Lee ................. | B82Y 10/00 257/288 |
| 7,795,687 B2 | 9/2010 | Suk et al. | |
| 8,124,961 B2 | 2/2012 | Suk et al. | |
| 8,309,950 B2 | 11/2012 | Iwayama et al. | |
| 8,313,990 B2 | 11/2012 | Bangsaruntip et al. | |
| 8,395,218 B2 * | 3/2013 | Suk ................. | B82Y 10/00 257/347 |
| 8,592,295 B2 | 11/2013 | Sleight et al. | |
| 8,741,756 B2 | 6/2014 | Franklin et al. | |

(Continued)

*Primary Examiner* — Brett Feeney
*Assistant Examiner* — Vincent Wall
(74) *Attorney, Agent, or Firm* — Lee & Morse P.C.

(57) ABSTRACT

A semiconductor device includes a semiconductor pattern on a substrate along a first direction, a blocking pattern on a top surface of the semiconductor pattern, a first wire pattern on the blocking pattern along a second direction different from the first direction, the first wire including a first part and a second part on opposite sides of the first part, a gate electrode surrounding the first part of the first wire pattern, and a contact surrounding the second part of the first wire pattern, wherein a height of a bottom surface of the contact from a top surface of the substrate is different from a height of a bottom surface of the gate electrode from the top surface of the substrate.

19 Claims, 29 Drawing Sheets

(56) References Cited

U.S. PATENT DOCUMENTS

| | | |
|---|---|---|
| 8,785,981 B1 | 7/2014 | Chang et al. |
| 8,835,993 B2 | 9/2014 | Yun et al. |
| 8,890,116 B2 | 11/2014 | Chen et al. |
| 8,900,959 B2 | 12/2014 | Chang et al. |
| 8,969,149 B2 | 3/2015 | Leobandung |
| 8,969,179 B2 | 3/2015 | Gotsmann et al. |
| 8,994,081 B2 | 3/2015 | Leobandung |
| 9,034,704 B2 | 5/2015 | Balakrishnan et al. |
| 9,224,812 B2 * | 12/2015 | Xiao ................. B82Y 10/00 |
| 9,349,868 B1 * | 5/2016 | Balakrishnan ...... H01L 29/7856 |
| 2006/0049429 A1 * | 3/2006 | Kim ................. H01L 29/42384 257/213 |
| 2011/0089400 A1 | 4/2011 | Ohlsson et al. |
| 2011/0133169 A1 * | 6/2011 | Bangsaruntip ......... B82Y 10/00 257/38 |
| 2012/0280205 A1 * | 11/2012 | Bangsaruntip ......... B82Y 10/00 257/9 |
| 2013/0341704 A1 | 12/2013 | Rachmady et al. |
| 2014/0197377 A1 * | 7/2014 | Kim ................. H01L 27/092 257/29 |
| 2014/0370667 A1 | 12/2014 | Sleight et al. |
| 2015/0021715 A1 | 1/2015 | Chang et al. |
| 2015/0140793 A1 | 5/2015 | Gotsmann et al. |
| 2015/0187762 A1 * | 7/2015 | Wahl ................. H01L 27/088 257/9 |

* cited by examiner

SEMICONDUCTOR DEVICE

CROSS-REFERENCE TO RELATED APPLICATION

Korean Patent Application No. 10-2015-0137683, filed on Sep. 30, 2015, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

As one of the scaling techniques for increasing the density of a semiconductor device, a multi-gate transistor and a multi-bridge channel have been suggested. The multi-gate transistor is obtained by forming a nanowire-shaped silicon body on a substrate and forming a gate to surround the silicon body.

The multi-gate transistor can be easily scaled because it uses a three-dimensional (3D) channel. In addition, the current control capability can be improved without the need to increase the gate length of the multi-gate transistor. Moreover, it is possible to effectively suppress a short channel effect (SCE) in which an electric potential of a channel region is affected by a drain voltage.

SUMMARY

Aspects of the present disclosure provide a semiconductor device which can suppress a short channel effect (SCE) by preventing the formation of a parasitic transistor.

According to some embodiments of the present disclosure, there is provided a semiconductor device including a semiconductor pattern which extends on a substrate along a first direction, a blocking pattern which is formed on a top surface of the semiconductor pattern, a first wire pattern which extends on the blocking pattern along a second direction different from the first direction and includes a first part and a second part disposed on both sides of the first part, a gate electrode which surrounds the first part of the first wire pattern and a contact which surrounds the second part of the first wire pattern, wherein a height of a bottom surface of the contact from a top surface of the substrate is different from a height of a bottom surface of the gate electrode from the top surface of the substrate.

In some embodiments of the present disclosure, the second part of the first wire pattern may perpendicularly overlap the blocking pattern.

In some embodiments of the present disclosure, the height of the bottom surface of the contact may be higher than that of the bottom surface of the gate electrode.

In some embodiments of the present disclosure, the first part of the first wire pattern may perpendicularly overlap the blocking pattern.

In some embodiments of the present disclosure, the height of the bottom surface of the contact may be lower than that of the bottom surface of the gate electrode.

In some embodiments of the present disclosure, the semiconductor device may further include a spacer which is disposed between the gate electrode and the contact.

In some embodiments of the present disclosure, the semiconductor device may further including a second wire pattern which is formed on the first wire pattern, wherein the second wire pattern includes a third part and a fourth part disposed on both sides of the third part, wherein the gate electrode surrounds the third part of the second wire pattern, and the contact surrounds the fourth part of the second wire pattern.

In some embodiments of the present disclosure, the semiconductor pattern may include a different material from the first wire pattern.

According to some embodiments of the present disclosure, there is provided a semiconductor device including a semiconductor layer which is formed on a substrate, a blocking pattern which extends on the semiconductor layer along a first direction and includes an opening, a first wire pattern which extends on the blocking pattern along a second direction different from the first direction and includes a first part and a second part disposed on both sides of the first part, a gate electrode which surrounds the first part of the first wire pattern and overlaps the opening and a contact which surround the second part of the first wire pattern on the blocking pattern.

In some embodiments of the present disclosure, the semiconductor layer may include a trench formed along the opening.

In some embodiments of the present disclosure, part of the gate electrode may fill the trench.

In some embodiments of the present disclosure, a depth of the trench may be equal to or smaller than a thickness of the semiconductor layer.

In some embodiments of the present disclosure, the semiconductor device may further include a spacer which is disposed between the gate electrode and the contact.

In some embodiments of the present disclosure, the semiconductor device may further include an epitaxial layer which surrounds the second part of the first wire pattern.

In some embodiments of the present disclosure, the semiconductor layer may include a different material from the first wire pattern.

According to some embodiments of the present disclosure, there is provided a semiconductor device including a semiconductor pattern on a substrate along a first direction, a blocking pattern on the semiconductor pattern, a gate electrode on the substrate along the first direction, the gate electrode being between portions of the semiconductor pattern, a contact on the blocking pattern, and a first wire pattern along a second direction different from the first direction, the first wire extending through the gate electrode and through the contact, wherein a height of a bottom surface of the contact from a top surface of the substrate is different from a height of a bottom surface of the gate electrode from a top surface of the substrate.

In some embodiments of the present disclosure, the bottom surface of the contact and the bottom surface of the gate electrode may overlap different portions of the substrate.

In some embodiments of the present disclosure, the contact may be above the blocking pattern.

In some embodiments of the present disclosure, the first wire may include a first part through the gate electrode, and a second part on opposite sides of the first part through the contact.

In some embodiments of the present disclosure, the second part of the first wire pattern overlaps the semiconductor pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
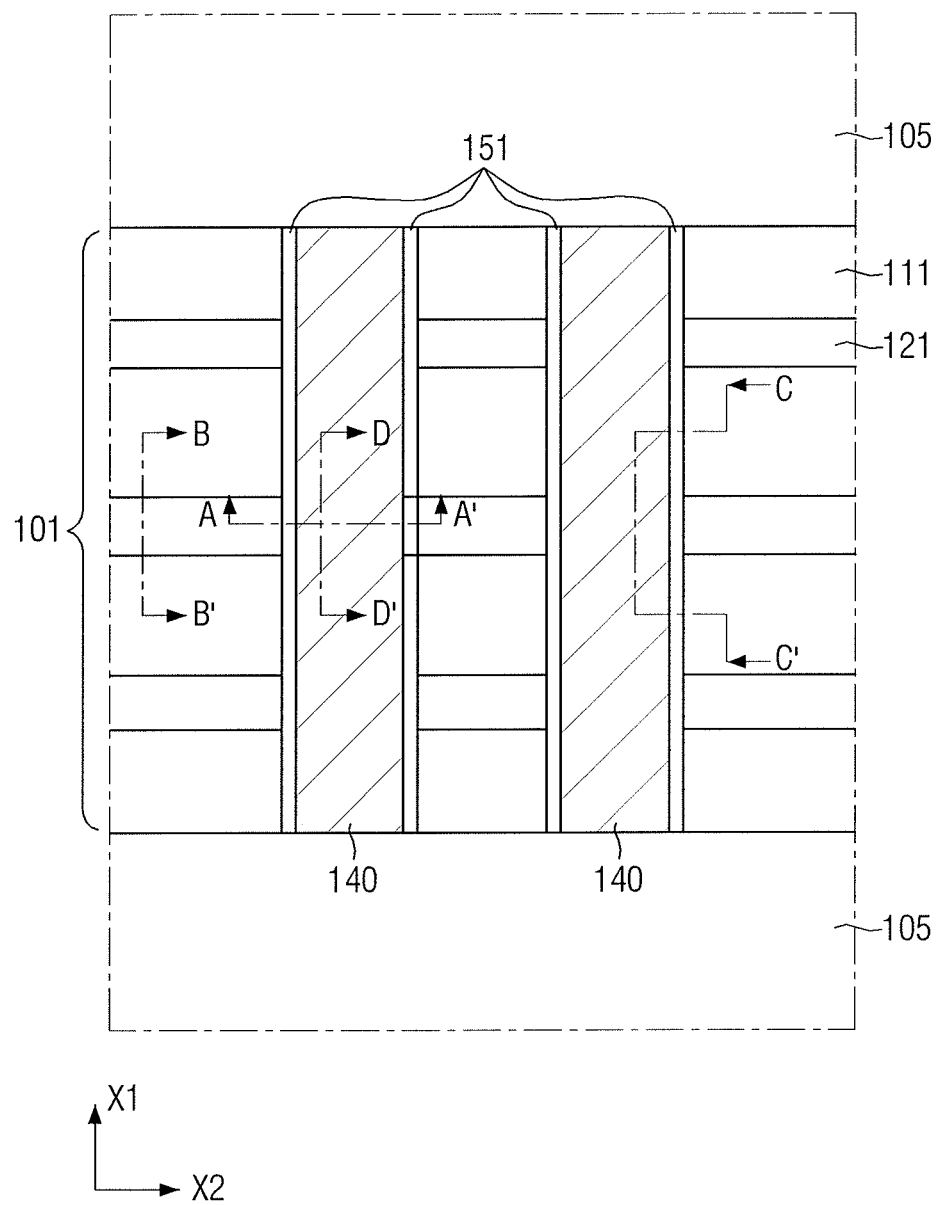
FIG. 1 illustrates a top view of a semiconductor device according to some embodiments of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the attached figures, the dimensions of layers and regions may be exaggerated for clarity. It will be understood that when an element or layer is referred to as being "connected to" or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. It will also be understood that when a layer is referred to as being "on" another layer or substrate, it can be directly on the other layer or substrate, or intervening layers may also be present. In contrast, when an element is referred to as being "directly on" another element, there are no intervening elements present. Like reference numerals refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

The use of the terms "a," "an," and "the," as well as other similar referents in the context of describing embodiments (especially in the context of the following claims), are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate embodiments and is not limiting unless otherwise specified. Further, unless defined otherwise, all terms defined in generally used dictionaries may not be overly interpreted.

A semiconductor device according to some embodiments of the present disclosure will now be described with reference to FIGS. 1 through 5.

Figure 2:
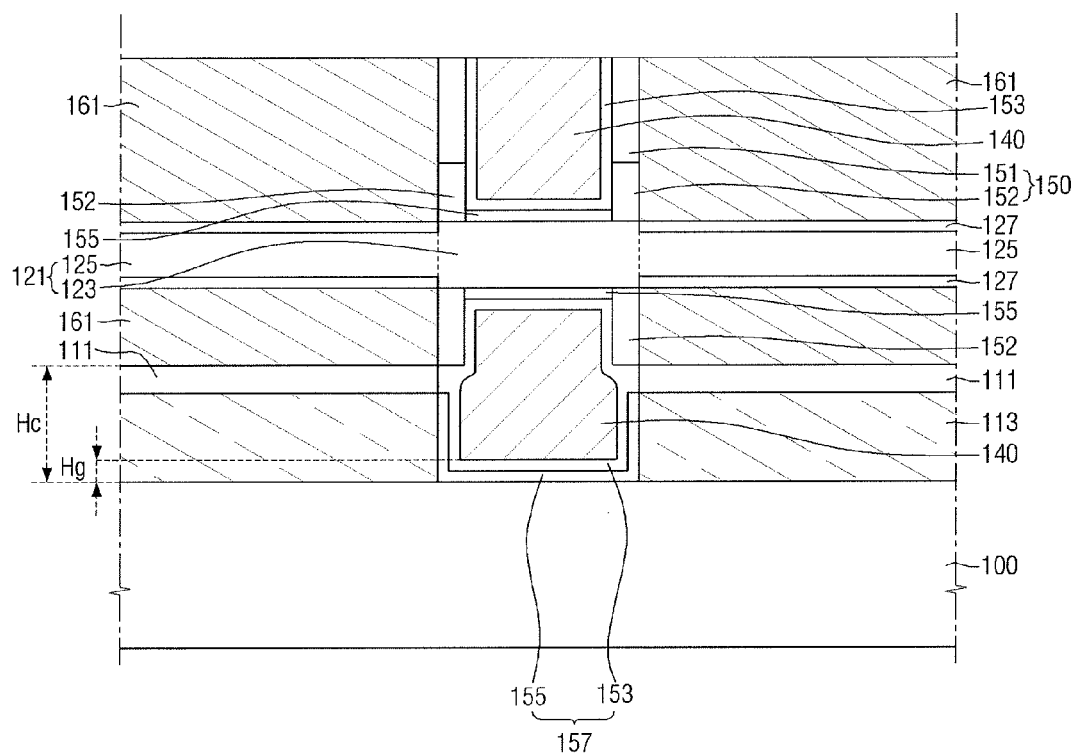
FIG. 2 illustrates a cross-sectional view taken along the line A-A' of FIG. 1.
Figure 3:
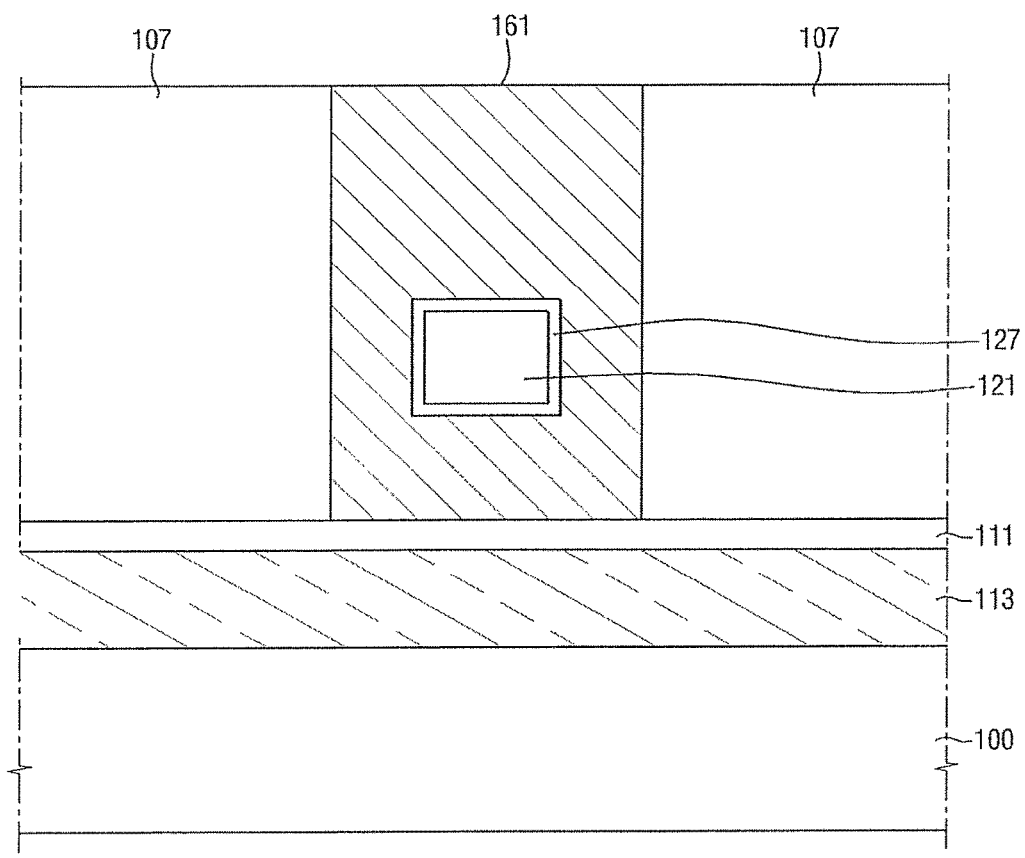
FIG. 3 illustrates a cross-sectional view taken along the line B-B' of FIG. 1.
Figure 4:
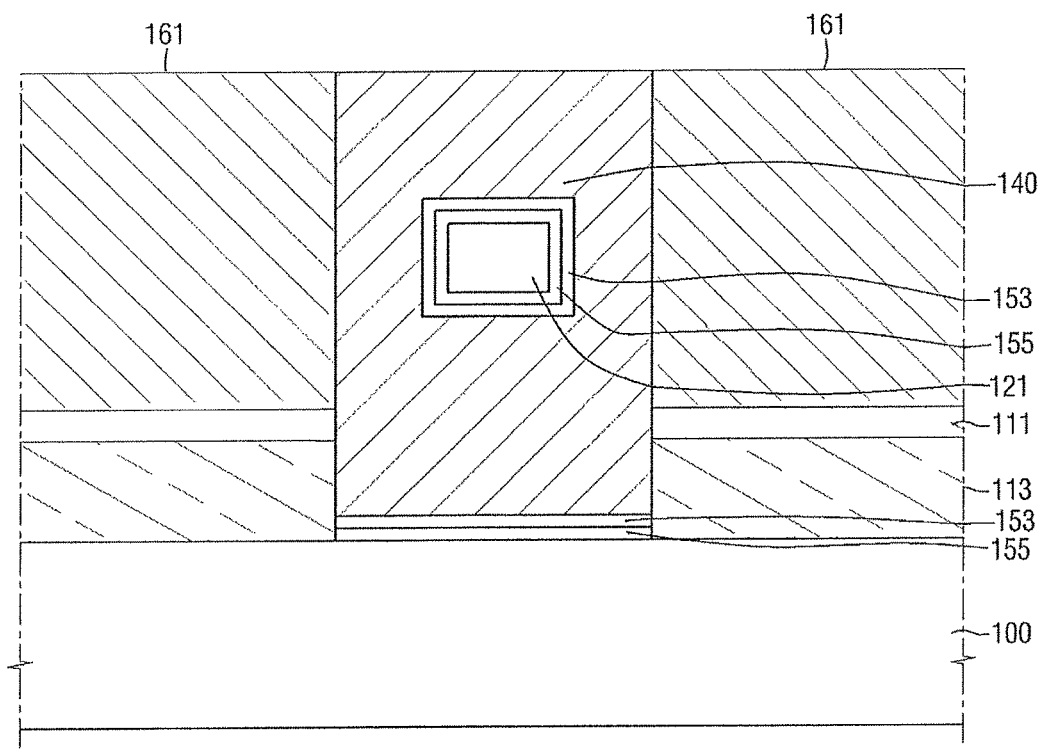
FIG. 4 illustrates a cross-sectional view taken along the line C-C' of FIG. 1.
Figure 5:
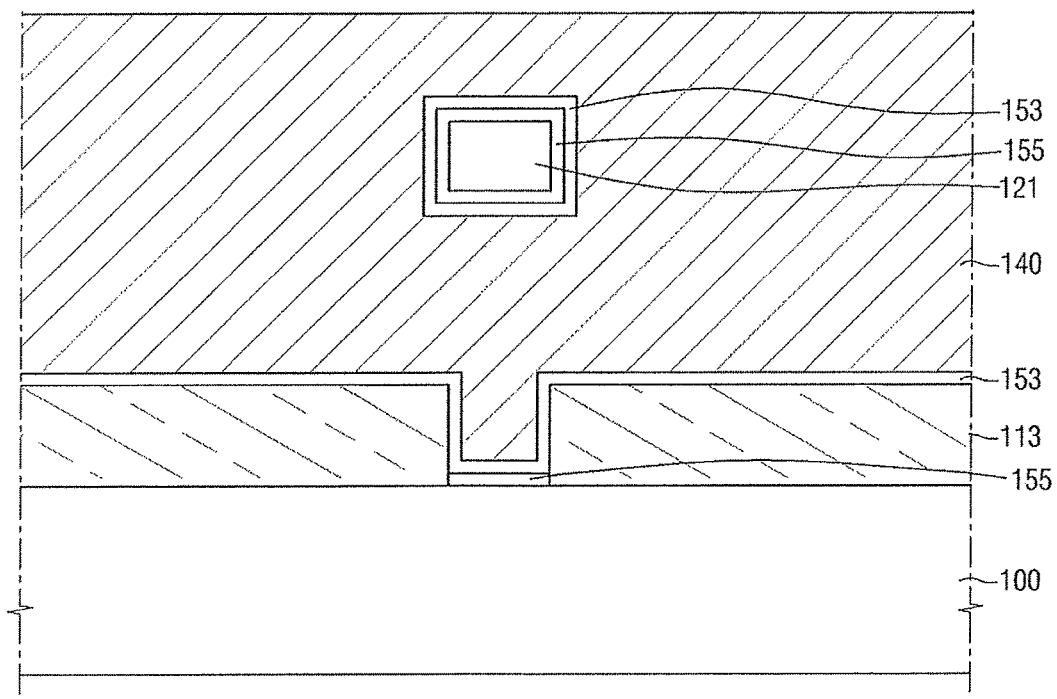
FIG. 5 illustrates a cross-sectional view taken along the line D-D' of FIG. 1.

FIG. 1 is a top view of a semiconductor device according to some embodiments of the present disclosure. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1. FIG. 5 is a cross-sectional view taken along the line D-D' of FIG. 1.

Referring to FIGS. 1 through 5, a semiconductor device according to some embodiments of the present disclosure may include a blocking pattern 111, a semiconductor pattern 113, a first wire pattern 121, a first epitaxial layer 127, a source/drain contact 161, and a gate electrode 140 in an active region 101 on a substrate 100. In FIG. 1, the source/drain contact 161, an interlayer insulating layer 107, and the first epitaxial layer 127 are not illustrated for ease of description.

In detail, referring to FIGS. 1-2, the substrate 100 may be a bulk silicon substrate or a silicon-on-insulator (SOI) substrate. For example, the substrate 100 may be a silicon substrate or a substrate made of another material, e.g., silicon germanium, indium antimonide, lead telluride, indium arsenide, indium phosphide, gallium arsenide or gallium antimonide. In another example, the substrate 100 may include, e.g., consist of, a base substrate and an epitaxial layer formed on the base substrate.

A field insulating layer 105 may be formed on the substrate 100 to define the active region 101. The field insulating layer 105 may not overlap the active region 101, but the present disclosure is not limited thereto. The field insulating layer 105 may be made of a material including at least one of, e.g., a silicon oxide layer, a silicon nitride layer, and an oxynitride layer. The active region 101 may include the blocking pattern 111, the semiconductor pattern 113, the gate electrode 140, the first wire pattern 121, etc. on the substrate 100.

Referring to FIGS. 2-3, the interlayer insulating layer 107 may be formed between the source/drain contacts 161. In the semiconductor device according to some embodiments of the present disclosure, the interlayer insulating layer 107 may be formed on a top surface of the blocking pattern 111. The interlayer insulating layer 107 may include at least one of a low-k material, an oxide layer, a nitride layer, and an oxynitride layer. The low-k material may be made of, but not limited to, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or any combination of the same.

The semiconductor pattern 113 may be formed on, e.g., directly on, the substrate 100 to extend along a first direction X1, e.g., portions of the semiconductor pattern 113 may be spaced apart from each other along a second direction X2 to define a stripe pattern (FIG. 2). As further illustrated in FIG. 2, the semiconductor pattern 113 may be formed in an area which perpendicularly, e.g., along the vertical direction, overlaps the source/drain contact 161 and a second part 125 of the first wire pattern 121.

The semiconductor pattern 113 may protrude from a top surface of the substrate 100. For example, in the semiconductor device according to some embodiments of the present disclosure, a top surface of the semiconductor pattern 113 may be at a greater height from the top surface of the substrate 100 than from a bottom surface of the gate electrode 140 which will be described later, e.g., a distance between the top surface of the semiconductor pattern 113 and the top surface of the substrate 100 may be greater than a distance between the top surface of the semiconductor pattern 113 and a bottom surface of the gate electrode 140.

The semiconductor pattern 113 may include silicon-germanium (SiGe). However, the present disclosure is not limited thereto. For example, the material that forms the semiconductor pattern 113 may vary depending on whether the semiconductor device is a p-channel metal oxide semiconductor (PMOS) or an re-channel metal oxide semiconductor (NMOS). The semiconductor pattern 113 may include a different material from, e.g., the first wire pattern 121.

The blocking pattern 111 may be formed on, e.g., directly on, the top surface of the semiconductor pattern 113 within the active region 101. For example, as illustrated in FIGS. 2 and 4, the blocking pattern 111 may be formed in an area which does not overlap the gate electrode 140. That is, the blocking pattern 111 may be formed in an area which perpendicularly, e.g., along the vertical direction, overlaps the source/drain contact 161 and the second part 125 of the first wire pattern 121. In another example, a part of the blocking pattern 111 may be formed in an area which overlaps the gate electrode 140, and the other part of the blocking pattern 111 may be formed in an area which overlaps the source/drain contact 161.

The blocking pattern 111 may extend in the same direction as the gate electrode 140, e.g., along the first direction X1. The blocking pattern 111 may be formed in a direction intersecting the first wire pattern 121. However, the present disclosure is not limited thereto, e.g., the blocking pattern 111 may also be formed in a different direction with respect to the first wire pattern 121.

The blocking pattern 111 may not protrude from the top surface of the semiconductor pattern 113. For example, in the semiconductor device according to some embodiments of the present disclosure, the top surface of the blocking pattern 111 may be at a greater height from the top surface of the substrate 100 than from the bottom surface of the gate electrode 140 which will be described later, e.g., a distance between the top surface of the blocking pattern 111 and the top surface of the substrate 100 may be greater than a distance between the top surface of the blocking pattern 111 and the bottom surface of the gate electrode 140.

The blocking pattern 111 may include, e.g., a silicon oxide ($SiO_2$)- or silicon nitride (SiN)-based material. However, the present disclosure is not limited thereto, e.g., the blocking pattern 111 may include a material having etch selectivity with respect to silicon (Si).

The first wire pattern 121 may be formed on the substrate 100 to be separated from the substrate 100. The first wire pattern 121 may extend along the second direction X2. For example, the first wire pattern 121 may extend in a different direction from the gate electrode 140, e.g., the first wire pattern 121 and the gate electrode 140 may be perpendicular to each other. However, the present disclosure is not limited thereto.

For example, the first wire pattern 121 may be formed on the blocking pattern 111 to be separated from the blocking pattern 111. In other words, a space may be formed between the first wire pattern 121 and the blocking pattern 111. The first wire pattern 121 may extend through the gate electrode 140. In the semiconductor device according to some embodiments of the present disclosure, the space formed between the first wire pattern 121 and the blocking pattern 111 may be filled with the source/drain contact 161. This will be described in detail later.

The first wire pattern 121 may include a first part 123 and the second part 125. For example, as illustrated in FIG. 2, the first part 123 may be a portion of the first wire pattern 121 overlapping, e.g., within, the gate electrode 140, while the second part 125 may be a portion of the first wire pattern 121 disposed on both sides of the first part 123, e.g., a portion outside the gate electrode 140 and overlapping the blocking pattern 111. In the semiconductor device according to some embodiments of the present disclosure, the second part 125 of the first wire pattern 121 may be located on the blocking pattern 111. In other words, the second part 125 of the first wire pattern 121 may perpendicularly overlap the blocking pattern 111 with respect to the top surface of the substrate 100, e.g., the second part 125 of the first wire pattern 121 may have a longitudinal direction extending along the second direction X2 to be perpendicular to a longitudinal direction of the blocking pattern 111.

In the drawings, a width of the first part 123 of the first wire pattern 121 in a thickness direction, i.e., the vertical direction in FIG. 2, is different from that of the second part 125 of the first wire pattern 121 in the thickness direction. However, this is merely for ease of description, and the present disclosure is not limited thereto. For example, the width of the first part 123 of the first wire pattern 121 in the thickness direction may also be equal to that of the second part 125 of the first wire pattern 121 in the thickness direction. Here, the thickness direction may be a direction perpendicular to, e.g., the top surface of the substrate 100.

In FIG. 3, the first wire pattern 121 may have a quadrilateral cross-section. However, the present disclosure is not limited thereto, e.g., corners of the first wire pattern 121 may be rounded by a trimming process.

Further, while FIG. 3 illustrates a single first wire pattern 121 within the source/drain contact 16, the present disclosure is not limited thereto. For example, the semiconductor device according to some embodiments of the present disclosure may include one or more first wire patterns within the source/drain contact 161. In this case, the first wire patterns may be separated from each other, as will be described later with reference to FIGS. 10A and 10B.

The first wire pattern 121 may include silicon (Si). However, the present disclosure is not limited thereto, e.g., the first wire pattern 121 may include a different material from the semiconductor pattern 113.

The first part 123 of the first wire pattern 121 may be used as a channel region of a transistor. The second part 125 of the first wire pattern 121 may be used as source/drain regions of the transistor.

When the transistor is a PMOS transistor, the second part 123 of the first wire pattern 121 may include a compressive stress material. In an example, the compressive stress material may be a material having a greater lattice constant than Si, e.g., SiGe. The compressive stress material can improve the mobility of carriers in the channel region by applying compressive stress to the first part 123.

When the transistor is an NMOS transistor, the second part 125 of the first wire pattern 125 may include the same material as the substrate 100 or a tensile stress material. In an example, when the substrate 100 is Si, the second part 125 of the first wire pattern 121 may be Si or a material having a smaller lattice constant than Si, e.g., e.g., SiC.

The gate electrode 140 may be formed on the substrate 100 to extend in the first direction X1. In FIG. 1, the first direction X1 and the second direction X2 are orthogonal to each other. However, the present disclosure is not limited thereto, e.g., the gate electrode 140 may be formed in a different direction than the first direction X1 while also being different than that of the first wire pattern 121.

The gate electrode 140 may surround the first part 123 of the first wire pattern 121, e.g., the first part 123 of the first wire pattern 121 may extend through the gate electrode 140 to have the gate electrode 140 surround the first part 123 as viewed in a plane shown in FIGS. 3 and 4. The gate electrode 140 may also be formed in a space between the first wire pattern 121 and the substrate 100.

The gate electrode 140 may include a conductive material. In the drawings, the gate electrode 140 is a single layer. However, the present disclosure is not limited thereto. For example, the gate electrode 140 may include a work function conductive layer which controls a work function and a filling conductive layer which fills a space formed by the work function conductive layer which controls the work function. The gate electrode 140 may include at least one of, e.g., TiN, WN, TaN, Ru, TiC, TaC, Ti, Ag, Al, TiAl, TiAlN, TiAlC, TaCN, TaSiN, Mn, Zr, W, and Al. Alternatively, the gate electrode 140 may be made of a material other than metal, e.g., Si or SiGe. The gate electrode 140 may be formed by, but not limited to, a replacement process.

Referring to FIG. 2, a gate insulating layer 157 may be formed between the first part 123 of the first wire pattern 121 and the gate electrode 140. The gate insulating layer 157 may also be formed between the substrate 100 and the gate electrode 140, and between gate spacers 150 and the gate electrode 140. In addition, the gate insulating layer 157 may be formed between the blocking pattern 111 and the gate electrode 140.

The gate insulating layer 157 may be formed along the circumference of the first wire pattern 121. For example, the gate insulating layer 157 may be formed along the circumference of the first part 123 of the first wire pattern 121. The gate insulating layer 157 may be formed along the top surface of the substrate 100. Further, the gate insulating layer 157 may be formed along sidewalls of the gate spacers 150. That is, the gate insulating layer 157 may be formed along sidewalls of first and second spacers 151 and 152.

For example, the gate insulating layer 157 may include a high-k insulating layer 153 and an interface layer 155. However, the present disclosure is not limited thereto. For example, the interface layer 155 of the gate insulating layer 157 can be omitted depending on the material of the first wire pattern 121.

The interface layer 155 may be formed around the first wire pattern 121. The interface layer 155 may be formed between the first part 123 of the first wire pattern 121 and the gate electrode 140, and between the substrate 100 and the gate electrode 140. In addition, in the semiconductor device according to some embodiments of the present disclosure, the interface layer 155 may be formed between the semiconductor pattern 113 and the gate electrode 140.

The high-k insulating layer 153 may be formed around the first wire pattern 121. The high-k insulating layer 153 may be formed between the first part 123 of the first wire pattern 121 and the gate electrode 140, between the substrate 100 and the gate electrode 140, and between the gate spacers 150 and the gate electrode 140. In addition, the high-k insulating layer 153 may be formed between the semiconductor pattern 113 and the gate electrode 140, and between the source/drain contact 161 and the gate electrode 140. The high-k insulating layer 153 may fill a space between the blocking pattern 111 and the gate electrode 140.

When the first wire pattern 121 includes Si, the interface layer 155 may include a silicon oxide ($SiO_2$) layer. Here, the interface layer 155 may be formed around the first wire pattern 121, on the top surface of the substrate 100, and between the semiconductor pattern 113 and the gate electrode 140. However, the interface layer 155 may not be formed along the sidewalls of the gate spacers 150.

The high-k insulating layer 153 may include a high-k material having a higher dielectric constant than a silicon oxide layer. For example, the high-k material may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. When the interface layer 155 is omitted as described above, the high-k insulating layer 153 can include not only the high-k material but also a silicon oxide layer, a silicon oxynitride layer, or a silicon nitride layer.

Referring to FIG. 3, the source/drain contact 161 may surround the second part 125 of the first wire pattern 121. In the semiconductor device according to some embodiments of the present disclosure, the source/drain contact 161 may be formed on the blocking pattern 111. In this case, the source/drain contact 161 may also be formed in a space between the first wire pattern 121 and the blocking pattern 111.

In the semiconductor device according to some embodiments of the present disclosure, the source/drain contact 161 may contact the blocking pattern 111. Here, as illustrated in FIG. 2, a height Hc of a bottom surface of the source/drain contact 161 from the top surface of the substrate 100 may be different from a height Hg of the bottom surface of the gate electrode 140 from the top surface of the substrate 100. For example, the height Hc of the bottom surface of the source/drain contact 161 from the top surface of the substrate 100 may be greater than the height Hg of the bottom surface of the gate electrode 140 from the top surface of the substrate 100.

In the semiconductor device according to the present disclosure, the height Hc is made different from the height Hg by forming the source/drain contact 161 on, e.g., above, the blocking pattern 111, thereby insulating the gate electrode 140 from the source/drain contact 161. That is, the blocking pattern 111 can suppress a short channel effect (SCE) by preventing the formation of a parasitic transistor.

In addition, the semiconductor device according to the present disclosure can improve the resistance of the source/drain contact 161.

In the drawings, a top surface of the source/drain contact 161 and a top surface of the gate electrode 140 lie in the same plane. However, this is merely for ease of description, and the present disclosure is not limited thereto. For example, the top surface of the source/drain contact 161 and the top surface of the gate electrode 140 may not lie in the same plane. Further, when the top surface of the source/drain contact 161 and the top surface of the gate electrode 140 do not lie in the same plane, a space between the top surface of the gate electrode 140 and the source/drain contact 161 or between the top surface of the source/drain contact 161 and the gate electrode 140 may be filled with an insulating material.

In the drawings, the source/drain contact 161 is shaped like a rectangular parallelepiped. However, this is merely for ease of description, and the present disclosure is not limited thereto. For example, the source/drain contact 161 may also be shaped like, e.g., a trapezoid, a cylinder, or an inverted trapezoid. For example, the source/drain contact 161 may include at least one of, but not limited to, aluminum (Al), tungsten (W), and copper (Cu).

The gate spacers 150 may be disposed between the gate electrode 140 and the source/drain contact 161. The gate spacers 150 may face each other with respect to the gate electrode 140. If the corners of the first wire pattern 121 surrounded by the gate electrode 140 are rounded by a trimming process, a cross-section of a part of a side surface of the first wire pattern 121 which contacts each of the gate spacers 150 may be different from a cross-section of the first wire pattern 121 which is surrounded by the gate electrode 140.

Each of the gate spacers 150 may include the first gate spacer 151 and the second gate spacer 152. However, the present disclosure is not limited thereto. For example, each of the gate spacers 150 may not include the second gate spacers 152, e.g., include only the first gate spacer 151. In this case, only the gate insulating layer 157 may be formed between the first wire pattern 121 and the top surface of the substrate 100.

The first gate spacer 151 and the second gate spacer 152 may contact each other. The first gate spacer 151 may be formed between the gate electrode 140 and the source/drain contact 161. In the drawings, the first gate spacer 151 has a single layer structure. However, the present disclosure is not limited thereto, e.g., the first gate spacer 151 may have a multilayer structure.

In the drawings, a sidewall at which the first gate spacer 151 contacts the source/drain contact 161 is the same as a boundary between the first part 123 and the second part 125 of the first wire pattern 121 (FIG. 2). However, this is merely for ease of description, and the present disclosure is not limited thereto. For example, the first gate spacer 151 may protrude further toward the source/drain contact 161 than the boundary between the first part 123 and the second part 125 of the first wire pattern 121.

For example, as illustrated in FIG. 2, the second gate spacer 152 may include plurality of portions separating portions of the gate electrode 140 from adjacent elements. The second gate spacer 152 may be formed between the first gate spacer 151 and the first wire pattern 121. The second gate spacer 152 may be formed between the top surface of the substrate 100 and the first wire pattern 121. The second gate spacer 152 may be formed between the gate electrode 140 and the source/drain contact 161. The second gate spacer 152 may be formed by, but not limited to, a replacement process.

In the drawings, the second gate spacer 152 is formed on, e.g., level with, the bottom surface of the source/drain contact 161. However, this is merely for ease of description, and the present disclosure is not limited thereto. For example, the second gate spacer 152 may be formed at a different location relative to the bottom surface of the source/drain contact 161 depending on process.

The second gate spacer 152 may have a rectangular shape. However, the present disclosure is not limited thereto, e.g., the second gate spacer 152 may have various shapes depending on process.

The first gate spacer 151 may include at least one of e.g., silicon nitride (SiN), silicon oxynitride (SiON), silicon oxide (SiO$_2$), silicon oxycarbonitride (SiOCN), and combinations of the same. The second gate spacer 152 may include the same material as the first gate spacer 151. However, the present disclosure is not limited thereto. For example, the second gate spacer 152 may include a material having a different dielectric constant from that of a material included in the first gate spacer 151, e.g., the second gate spacer 152 may include a material having a smaller dielectric constant than that of the material included in the first gate spacer 151.

When the dielectric constant of the material included in the first gate spacer 151 is higher than that of the material included in the second gate spacer 152, fringing capacitance between the gate electrode 140 and the second part 125 (i.e., the source/drain regions) of the first wire pattern 121 may be reduced. When the dielectric constant of the material included in the second gate spacer 152 is lower than that of the material included in the first gate spacer 151, the second gate spacer 152 may include at least one of, e.g., a low-k dielectric material, silicon nitride (SiN), silicon oxynitride (SiON), silicon oxide (SiO$_2$), silicon oxycarbonitride (SiOCN), and combinations of the same. The low-k dielectric material may be a material having a smaller dielectric constant than silicon oxide.

The first epitaxial layer 127 may be formed around the second part 125 of the first wire pattern 121. Here, the source/drain contact 161 may be formed around the first epitaxial layer 127.

In FIG. 3, the first epitaxial layer 127 has a quadrilateral cross-sectional shape. However, the present disclosure is not limited thereto. For example, the first epitaxial layer 127 may have various shapes, e.g., a hexagonal shape, depending on the degree of epitaxial growth.

In FIG. 2, a top surface of the first epitaxial layer 127 and a top surface of the first part 123 of the first wire pattern 121 lie in the same plane with respect to the top surface of the substrate 100. However, this is merely for ease of description, and the present disclosure is not limited thereto, e.g., the top surface of the first epitaxial layer 127 may not lie in a same plane with the top surface of the first part 123 of the first wire pattern 121 with respect to the top surface of the substrate 100. The first epitaxial layer 127 may include the same material as the second part 125 of the first wire pattern 121, but the present disclosure is not limited thereto.

A semiconductor device according to some embodiments of the present disclosure will now be described with reference to FIG. 6. For clarity, a redundant description of elements identical to those described above will be omitted.

Figure 6:
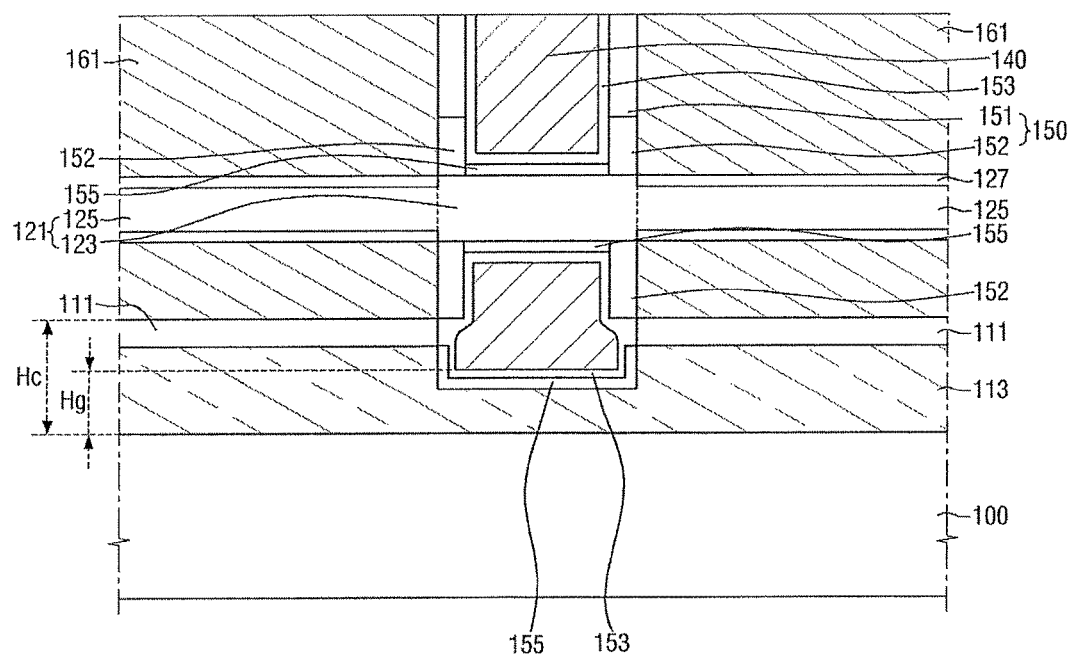
FIG. 6 illustrates a cross-sectional view of a semiconductor device according to some embodiments of the present disclosure.

FIG. 6 is a cross-sectional view of a semiconductor device according to some embodiments of the present disclosure, taken along the line A-A' of FIG. 1.

Referring to FIG. 6, the semiconductor pattern 113 may be formed on the substrate 100 not only in an area which overlaps the source/drain contact 161 and the second part 125 of the first wire pattern 121 but also in an area which overlaps the gate electrode 140. For example, the semiconductor pattern 113 may be formed to, e.g., continuously, cover the substrate 100 in regions under the gate electrodes 140 and between adjacent gate electrode 140. Accordingly, the semiconductor pattern 113 may be formed in an area overlapping both the first and second parts 123 and 125 of the first wire pattern 121.

As discussed previously with respect to the previous embodiments, the height Hc of the bottom surface of the source/drain contact 161 may be different from the height Hg of the bottom surface of the gate electrode 140. For example, the height Hc of the bottom surface of the source/drain contact 161 may be higher than the height Hg of the bottom surface of the gate electrode 140.

A semiconductor device according to some embodiments of the present disclosure will now be described with reference to FIG. 7. For clarity, a redundant description of elements identical to those described above is omitted.

Figure 7:
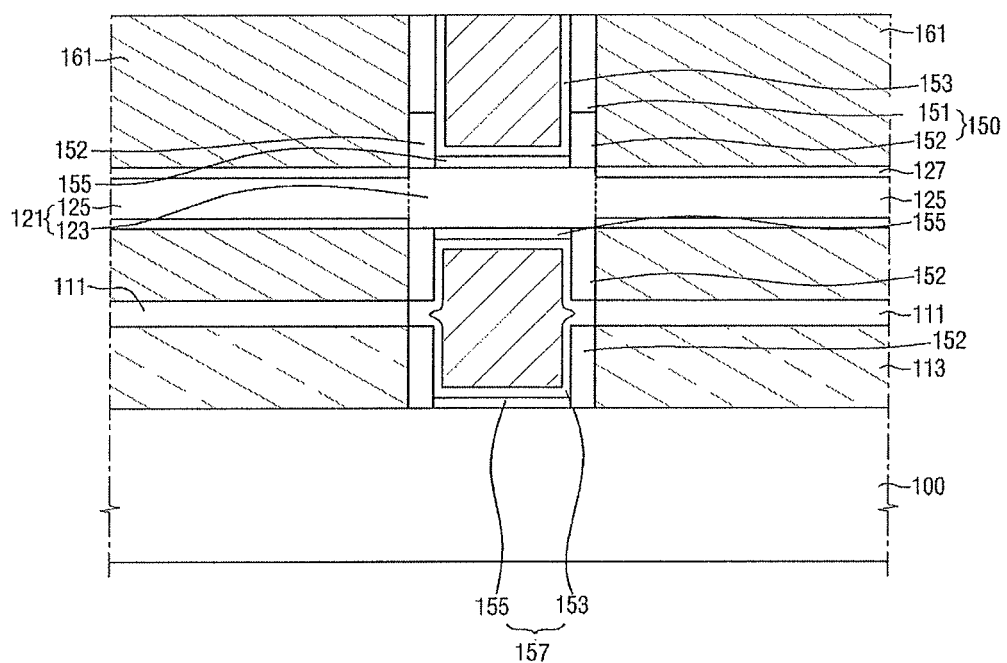
FIG. 7 illustrates a cross-sectional view of a semiconductor device according to some embodiments of the present disclosure.

FIG. 7 is a cross-sectional view of a semiconductor device according to some embodiments of the present disclosure, taken along the line A-A' of FIG. 1.

Referring to FIG. 7, the second spacer 152 may also be formed between the gate electrode 140 and the semiconductor pattern 113. The second gate spacer 152 may not be formed between the blocking pattern 111 and the gate electrode 140. However, the present disclosure is not limited thereto. The second gate spacer 152 can also be formed between the blocking pattern 111 and the gate electrode 140 depending on process. In addition, a part of the second gate spacer 152 may be formed between the blocking pattern 111 and the gate electrode 140. The second gate spacer 152 may be formed by, but not limited to, a gate first process. An interface layer 155 may be formed between the substrate 100 and the gate electrode 140.

A semiconductor device according to some embodiments of the present disclosure will now be described with reference to FIGS. 8a through 8c. For clarity, a redundant description of elements identical to those described above will be omitted.

Figure 8A:
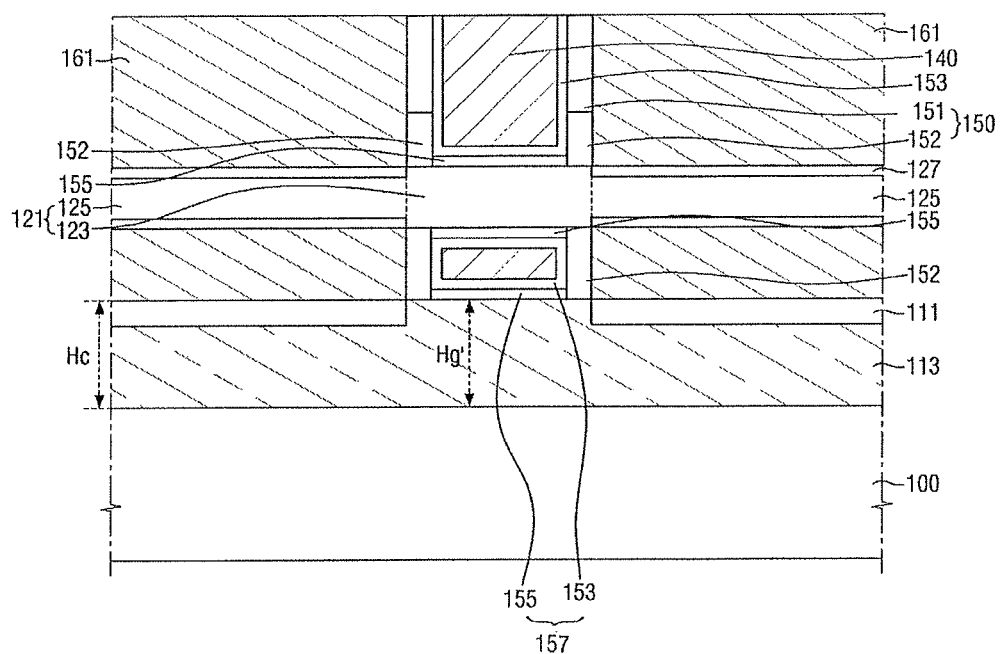
FIGS. 8a through 8c illustrate cross-sectional views of a semiconductor device according to some embodiments of the present disclosure.
Figure 8B:
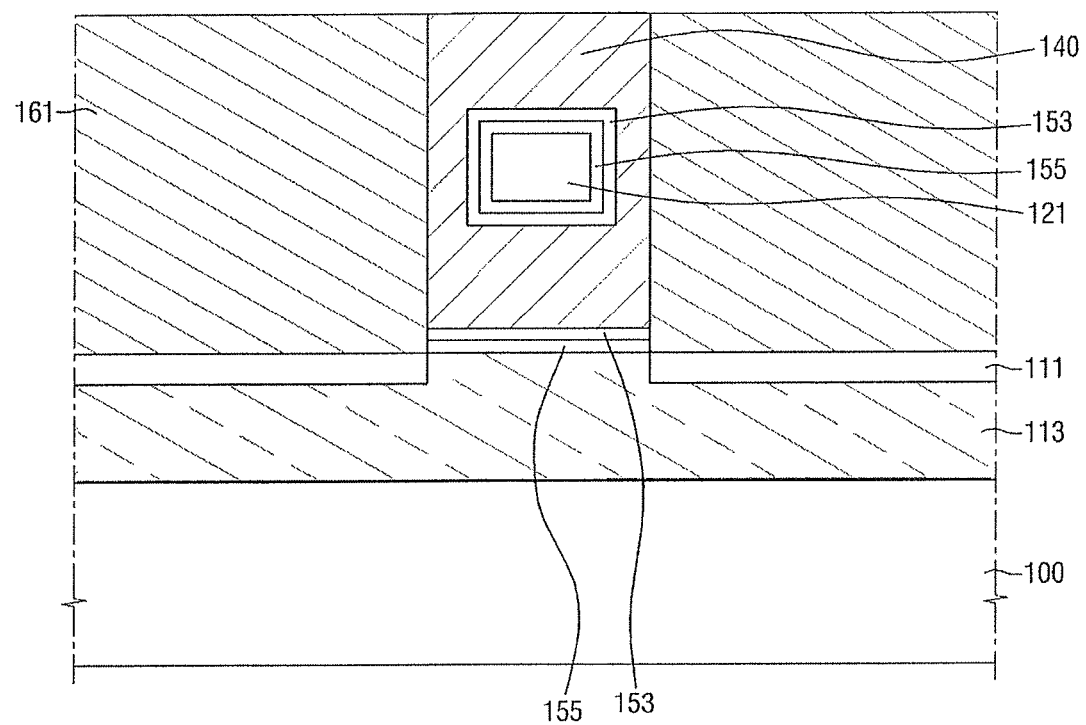
Figure 8C:
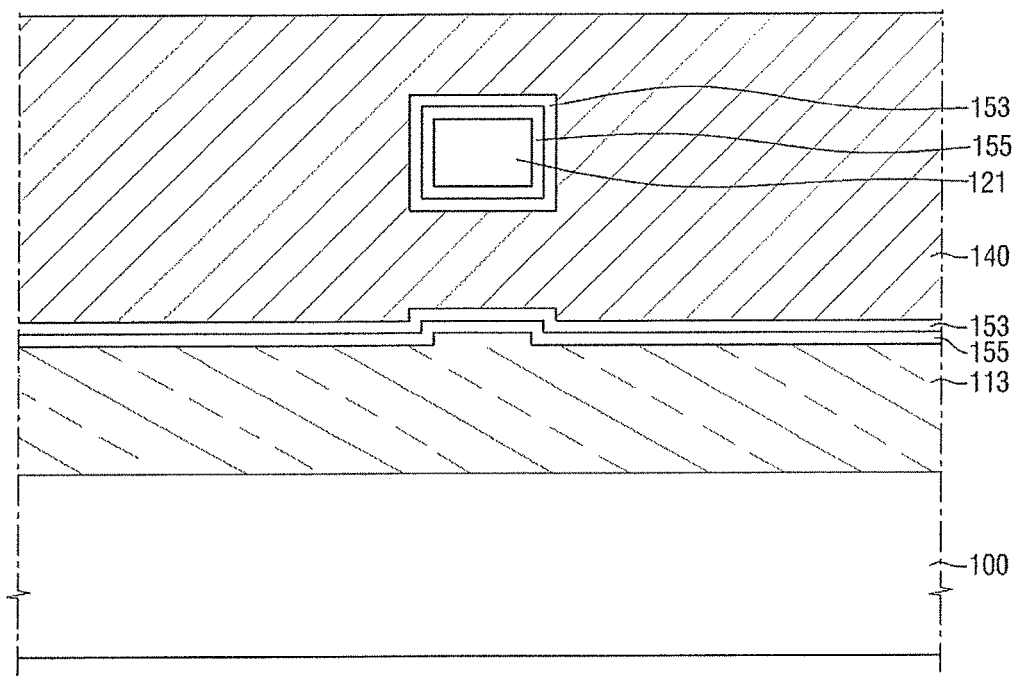

FIGS. 8a through 8c are cross-sectional views of a semiconductor device according to some embodiments of the present disclosure. Specifically, FIG. 8a is a cross-sectional view taken along the line A-A' of FIG. 1. FIG. 8b is a cross-sectional view taken along the line C-C' of FIG. 1. FIG. 8c is a cross-sectional view taken along the line D-D' of FIG. 1.

Referring to FIGS. 8a through 8c, the height He of the bottom surface of the source/drain contact 161 from the top surface of a substrate 100 may be equal to a height Hg' of the bottom surface of a gate structure from the top surface of the substrate 100. Here, the gate structure may include the gate electrode 140, the gate spacers 150, and the gate insulating layer 157.

In FIG. 8b, the semiconductor pattern 113 may also be formed between the gate electrode 140 and the substrate 100. The second gate spacer 152 may be formed between the gate electrode 140 and the source/drain contact 161.

A semiconductor device according to some embodiments of the present disclosure will now be described with reference to FIGS. 9a through 9d. For clarity, a redundant description of elements identical to those described above will be omitted.

Figure 9A:
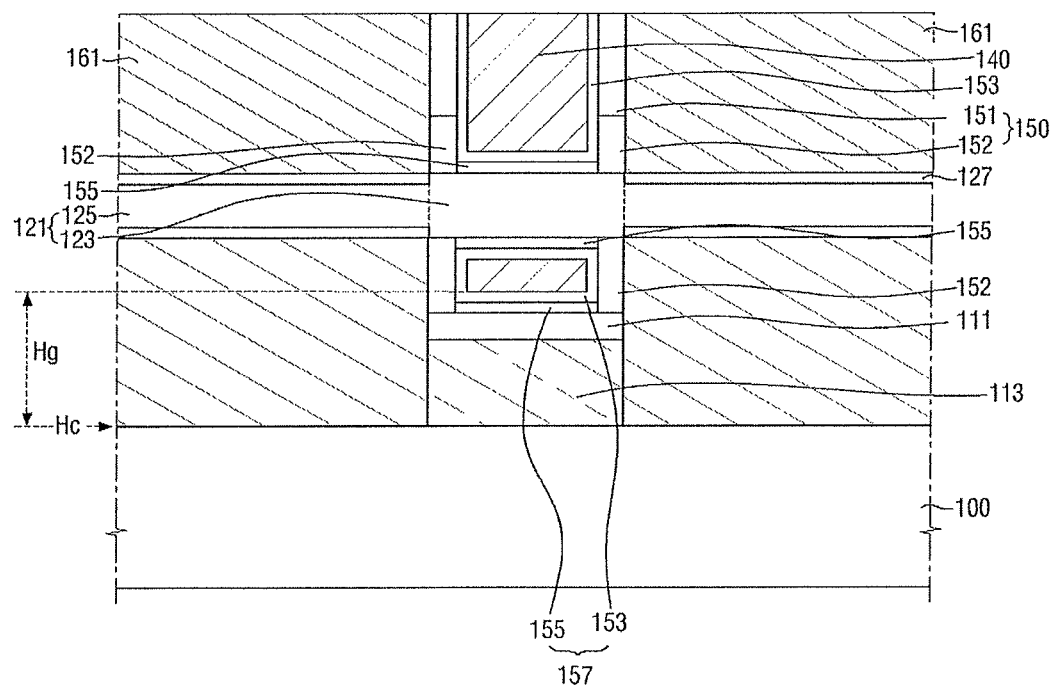
FIGS. 9a-9d, 10a-10b, and 11a-11b illustrate cross-sectional views of semiconductor devices according to some embodiments of the present disclosure.
Figure 9B:
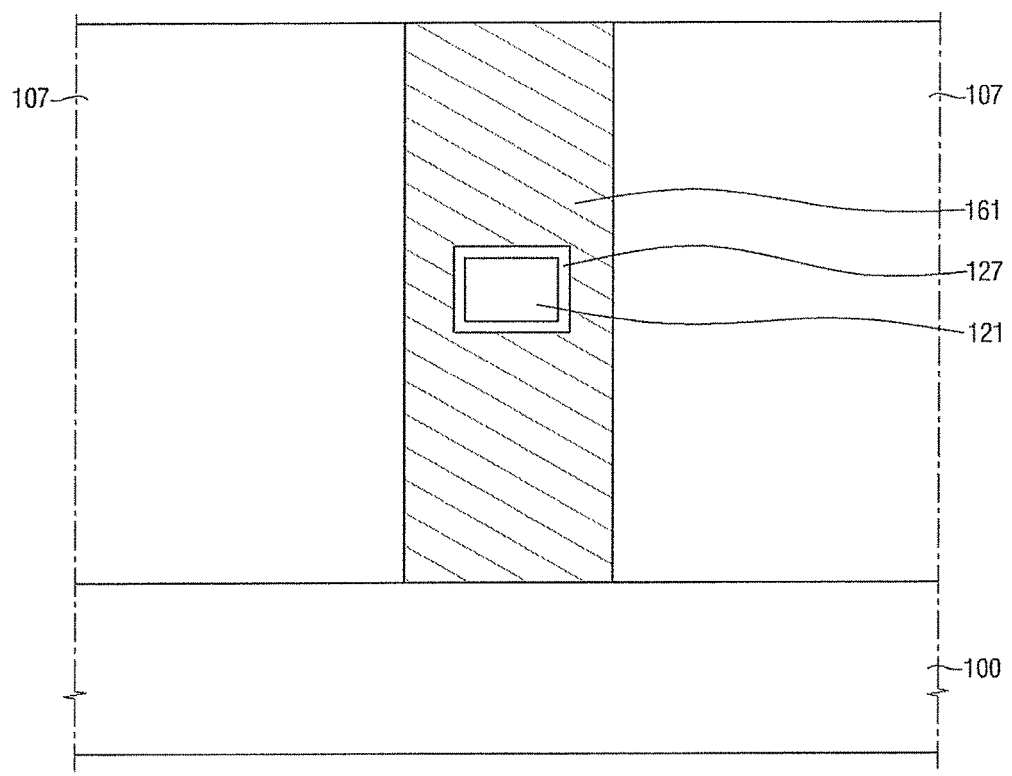
Figure 9C:
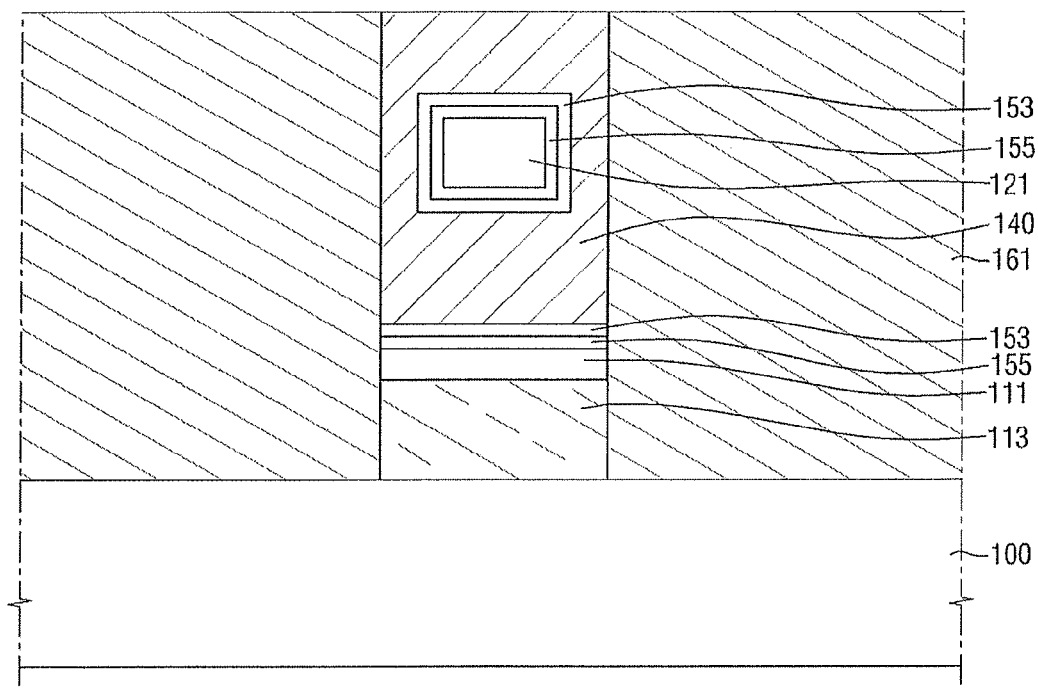
Figure 9D:
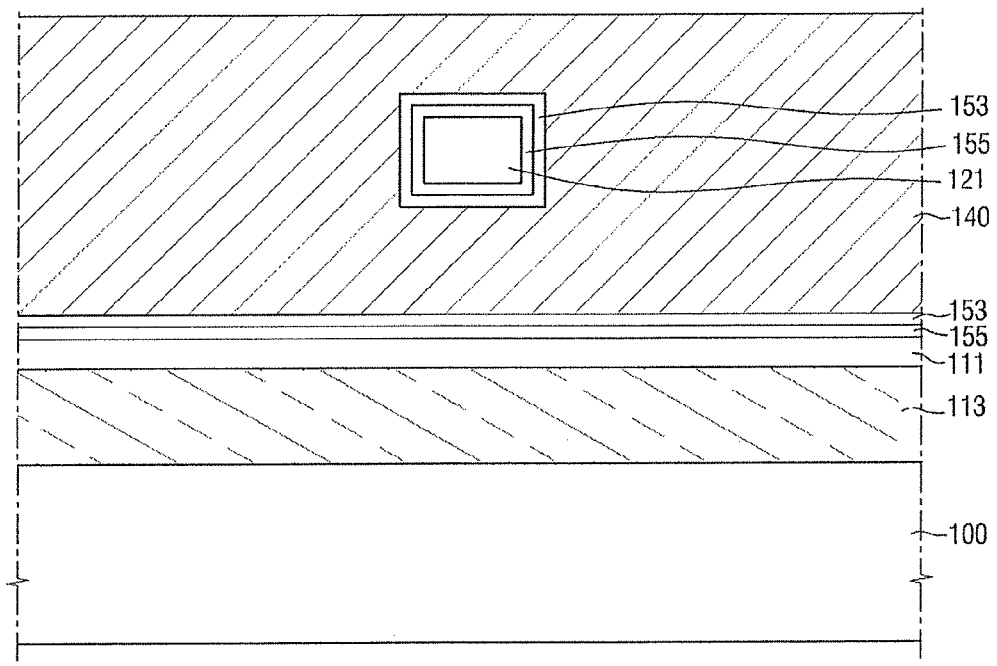

FIGS. 9a through 9d are cross-sectional views of a semiconductor device according to some embodiments of the present disclosure. Specifically, FIG. 9a is a cross-sectional view taken along the line A-A' of FIG. 1. FIG. 9b is a cross-sectional view taken along the line B-B' of FIG. 1. FIG. 9c is a cross-sectional view taken along the line C-C' of FIG. 1. FIG. 9d is a cross-sectional view taken along the line D-D' of FIG. 1.

Referring to FIGS. 9a through 9d, in the semiconductor device according to some embodiments of the present disclosure, the blocking pattern 111 may be formed in an area which perpendicularly, e.g., along the vertical direction, overlaps the first part 123 of the first wire pattern 121. The blocking pattern 111 may not be formed in an area which perpendicularly overlaps the second part 125 of the first wire pattern 121. The semiconductor pattern 113 may be formed in an area which perpendicularly overlaps the first part 123 of the first wire pattern 121.

In FIG. 9a, a width of the blocking pattern 111 in a horizontal direction is equal to a width of the first part 123 of the first wire pattern 121 in the horizontal direction with respect to a top surface of the substrate 100. However, the present disclosure is not limited thereto. For example, the blocking pattern 111 may be formed wider than the first part 123 of the first wire pattern in the horizontal direction. That is, a part of the blocking pattern 111 can extend into the source/drain contact 161.

The height Hc of the bottom surface of the source/drain contact 161 from the top surface of the substrate 100 may be lower than the height Hg of the bottom surface of the gate electrode 140.

A semiconductor device according to some embodiments of the present disclosure will now be described with reference to FIGS. 10a and 10b. For clarity, a redundant description of elements identical to those described above will be omitted.

Figure 10A:
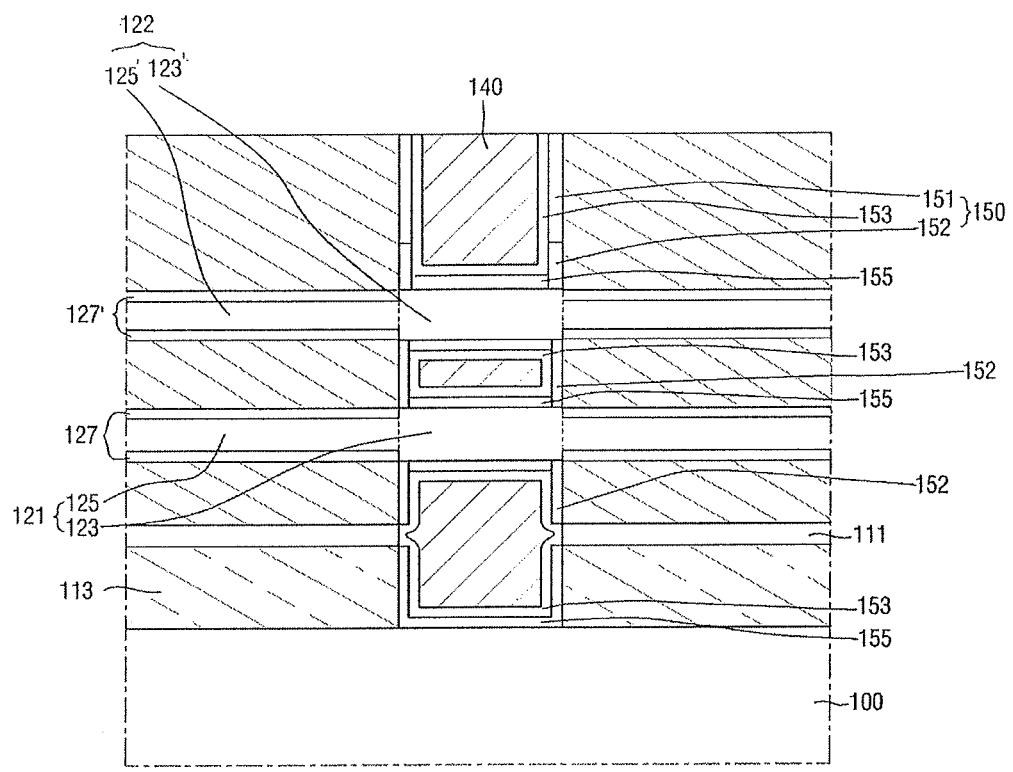
Figure 10B:
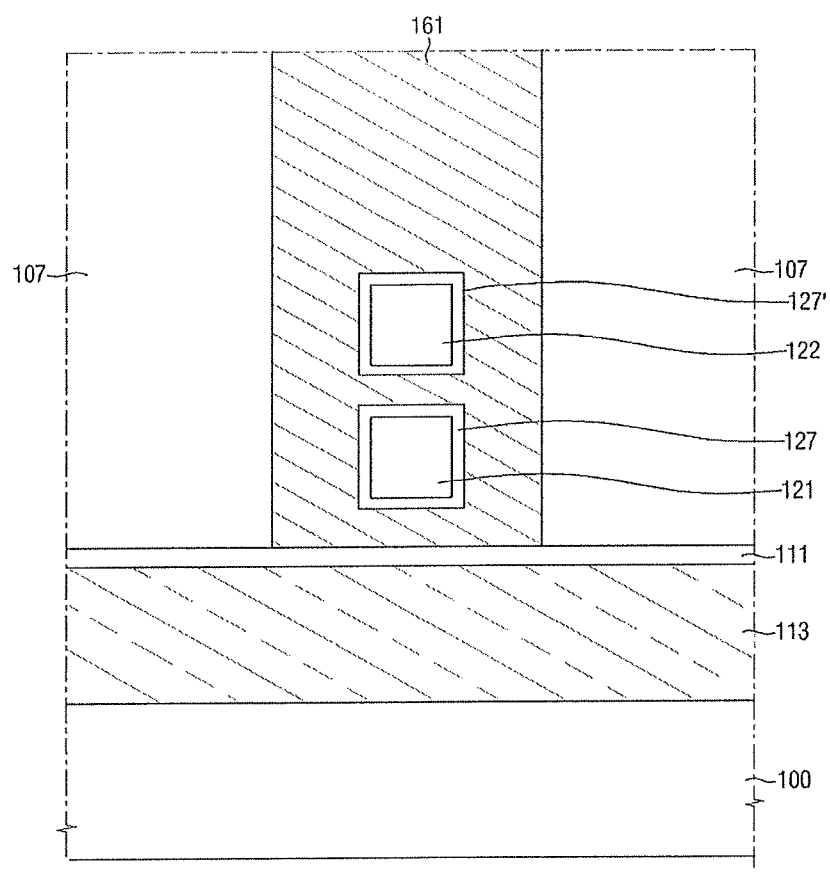

FIGS. 10a and 10b are cross-sectional views of a semiconductor device according to some embodiments of the present disclosure. Specifically, FIG. 10a is a cross-sectional view taken along the line A-A' of FIG. 1. FIG. 10b is a cross-sectional view taken along the line B-B' of FIG. 1.

FIGS. 10a and 10b illustrate a case where a semiconductor device according to some embodiments of the present disclosure has a plurality of wire patterns as mentioned above.

Referring to FIGS. 10a and 10b, the semiconductor device according to some embodiments of the present disclosure may further include a second wire pattern 122 on the first wire pattern 121. The second wire pattern 122 may be formed on the substrate 100 to be separated from the substrate 100. The second wire pattern 122 may extend along the second direction X2. However, the present disclosure is not limited thereto. For example, the second wire pattern 122 may extend in a different direction from a gate electrode 140.

For example, the second wire pattern 122 may be formed on the blocking pattern 111 to be separated from the blocking pattern 111. In other words, a space may be formed between the second wire pattern 122 and the blocking pattern 111. The second wire pattern 122 may extend through the gate electrode 140.

For example, when the first wire pattern 121 and the second wire pattern 122 are perpendicularly, e.g., i.e., vertically, separated from each other with respect to the top surface of the substrate 100, a space formed between a fourth part 125' of the second wire pattern 122 and the second part 125 of the first wire pattern 121 may be filled with the source/drain contact 161.

The second wire pattern 122 may include a third part 123' and the fourth part 125'. The fourth part 125' may be disposed on both sides of the third part 123'. In the semiconductor device according to some embodiments of the present disclosure, the fourth part 125' of the second wire pattern 122 may be located on the blocking pattern 111. In other words, the fourth part 125' of the second wire pattern 122 may perpendicularly overlap the blocking pattern 111 with respect to the top surface of the substrate 100.

The gate electrode 140 may surround the third part 123' of the second wire pattern 122. The source/drain contact 161 may surround the fourth part 125' of the second wire pattern 122.

In the drawings, a width of the third part 123' of the second wire pattern 122 in a thickness direction is different from a width of the fourth part 125' of the second wire pattern 122 in the thickness direction. However, this is merely for ease of description, and the present disclosure is not limited thereto. For example, the width of the third part 123' of the second wire pattern 122 in the thickness direction may also be equal to that of the fourth part 125' of the second wire pattern 122 in the thickness direction. Here, the thickness direction may be a direction perpendicular to, e.g., the top surface of the substrate 100.

In FIG. 10b, the second wire pattern 122 may have a quadrilateral cross-section. However, the present disclosure is not limited thereto, e.g., corners of the second wire pattern 122 can be rounded by a trimming process.

The second wire pattern 122 may include silicon (Si). However, the present disclosure is not limited thereto, e.g., the second wire pattern 122 may include a different material from the semiconductor pattern 113.

The third part 123' of the second wire pattern 122 may be used as a channel region of a transistor. The fourth part 125' of the second wire pattern 122 may be used as source/drain regions of the transistor.

When the transistor is a PMOS transistor, the fourth part 125' of the second wire pattern 122 may include a compressive stress material. In an example, the compressive stress material may be a material having a greater lattice constant than Si, e.g., SiGe. The compressive stress material can improve the mobility of carriers in the channel region by applying compressive stress to the third part 123' of the second wire pattern 122.

When the transistor is an NMOS transistor, the fourth part 125' of the second wire pattern 122 may include the same material as the substrate 100 or a tensile stress material. In an example, when the substrate 100 is Si, the fourth part 125' of the second wire pattern 122 may be Si or a material having a smaller lattice constant than Si, e.g., SiC.

A second epitaxial layer 127' may be formed around the fourth part 125' of the second wire pattern 122. Here, the source/drain contact 161 may be formed around the second epitaxial layer 127'.

In FIG. 10b, the second epitaxial layer 127' has a quadrilateral cross-sectional shape. However, the present disclosure is not limited thereto, e.g., the second epitaxial layer 127' can have various shapes, e.g., a hexagonal shape, depending on the degree of epitaxial growth.

In FIG. 10a, a top surface of the second epitaxial layer 127' and a top surface of the third part 123' of the second wire pattern 122 lie in the same plane with respect to the top surface of the substrate 100. However, this is merely for ease of description, and the present disclosure is not limited thereto. That is, the top surface of the second epitaxial layer 127' may not lie in the same plane with the top surface of the third part 123' of the second wire pattern 122 with respect to the top surface of the substrate 100. The second epitaxial layer 127' may include the same material as the fourth part 125' of the second wire pattern 122, but the present disclosure is not limited thereto.

In FIGS. 10a and 10b, the second wire pattern 122 is perpendicularly, i.e., vertically, separated from the first wire pattern 121 with respect to the top surface of the substrate 100. However, the present disclosure is not limited thereto.

A semiconductor device according to some embodiments of the present disclosure will now be described with reference to FIGS. 11a and 11b. For clarity, a redundant description of elements identical to those described above will be omitted.

Figure 11A:
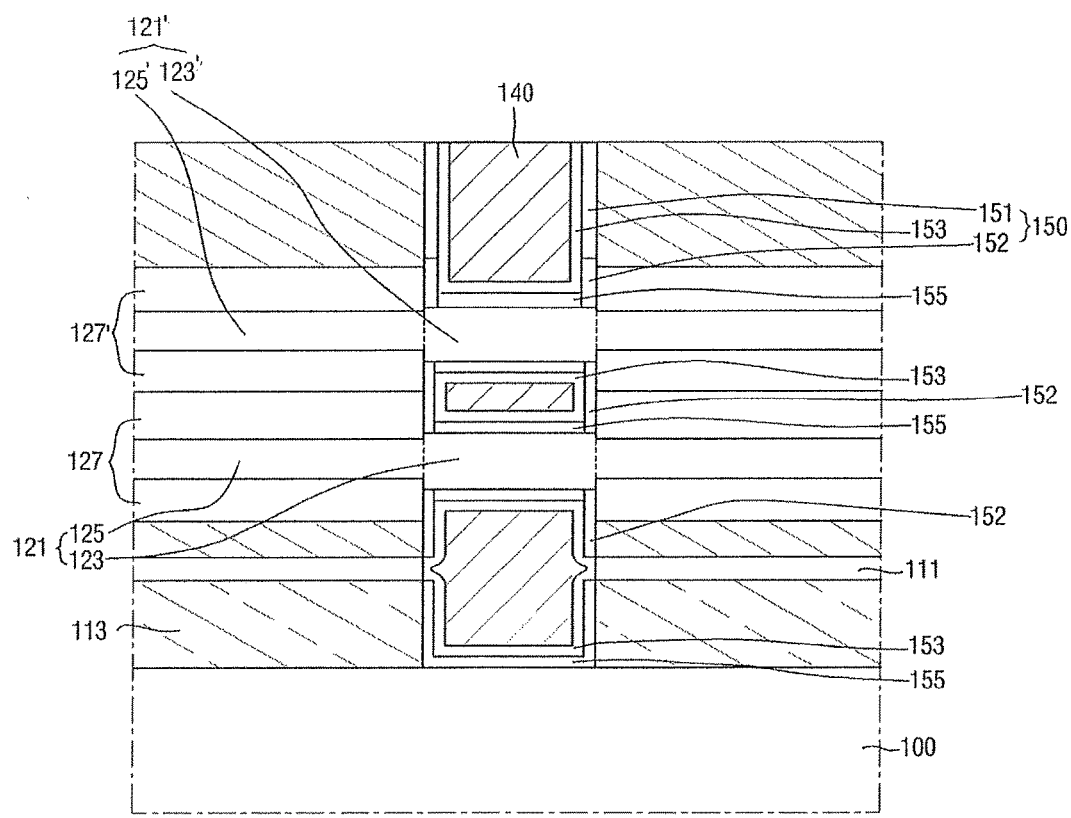
Figure 11B:
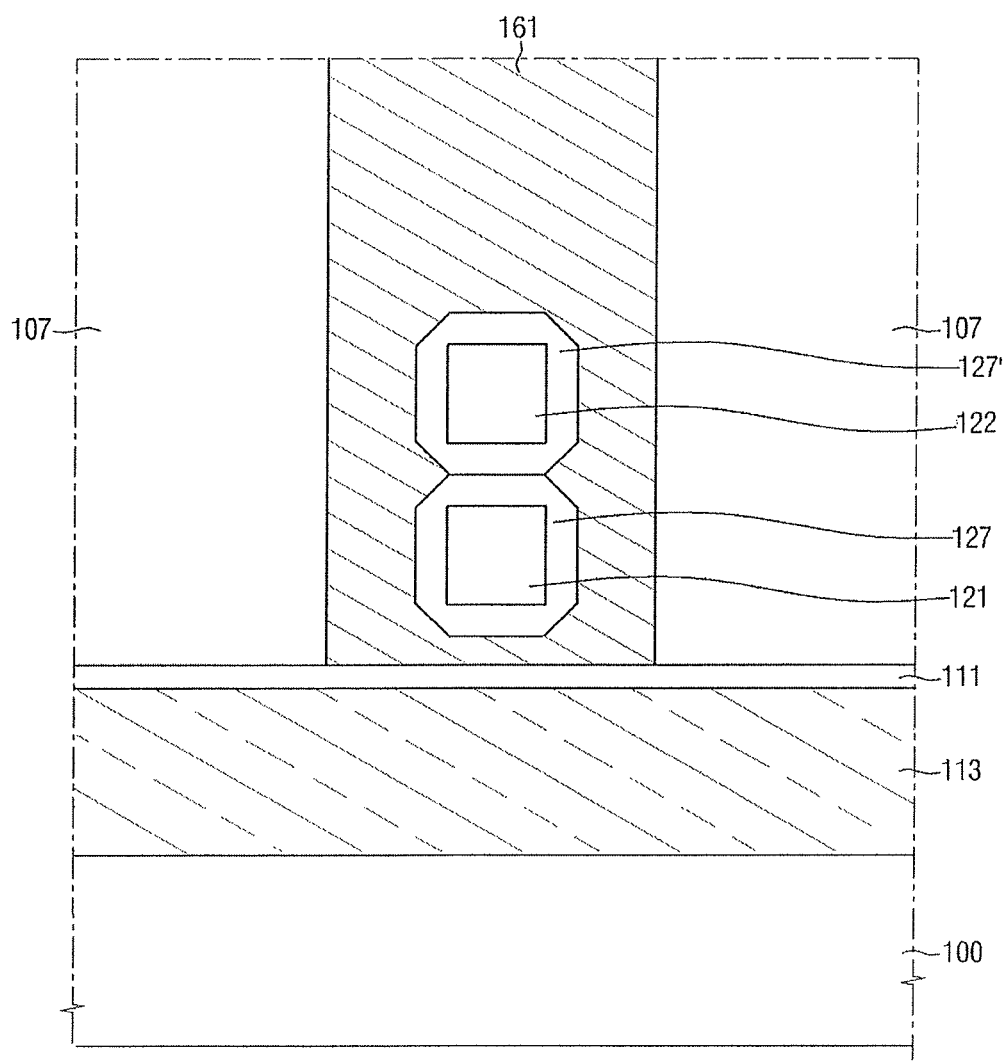

FIGS. 11a and 11b are cross-sectional views of a semiconductor device according to some embodiments of the present disclosure. Specifically, FIG. 11a is a cross-sectional view taken along the line A-A' of FIG. 1. FIG. 11b is a cross-sectional view taken along the line B-B' of FIG. 1.

FIGS. 11a and 11b illustrate a case where a semiconductor device according to some embodiments of the present disclosure has a plurality of wire patterns as mentioned above.

In the semiconductor device according to some embodiments of the present disclosure, the first epitaxial layer 127 and the second epitaxial layer 127' may contact each other. In this case, a space may not be formed between the fourth part 125' of the second wire pattern 122 and the second part 125 of the first wire pattern 121. In FIG. 11b, the source/drain contact 161 may be formed around the first epitaxial layer 127 and the second epitaxial layer 127' which contact each other.

A method of manufacturing a semiconductor device according to some embodiments of the present disclosure will now be described with reference to FIGS. 1 through 8c, 10a through 11b, and 12 through 21.

FIGS. 12 through 21 are views illustrating stages in a method of manufacturing a semiconductor device according to some embodiments of the present disclosure. FIGS. 12 through 21 are cross-sectional views taken along the line A-A' of FIG. 1.

Figure 12:
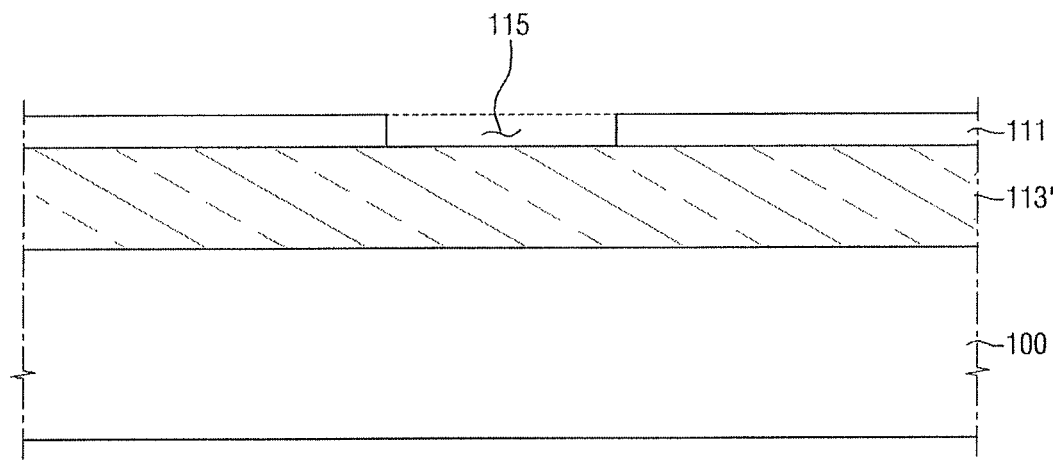
FIGS. 12 through 21 illustrate cross-sectional views of stages in a method of manufacturing a semiconductor device according to some embodiments of the present disclosure.

Referring to FIGS. 2 and 12, a semiconductor layer 113' is formed on the substrate 100. The semiconductor layer 113' may be formed by an epitaxial process using the top surface of the substrate 100 as a seed. However, the present disclosure is not limited thereto, and the semiconductor layer 113' may also be formed by any other suitable process.

The blocking pattern 111 may be formed on the semiconductor layer 113' to extend along the first direction X1. The blocking pattern 111 may include an opening 115. The blocking pattern 111 may be formed on the semiconductor layer 113' using, e.g., a dummy gate as a mask. In this case, the opening 115 may be formed by removing the mask, e.g., the dummy gate, after the formation of the blocking pattern 111.

Figure 13:
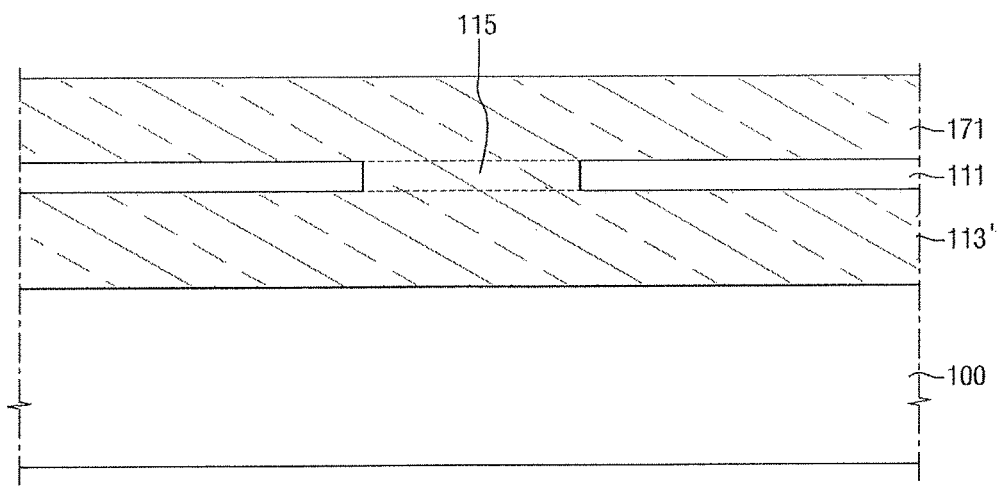

Referring to FIGS. 2 and 13, a first sacrificial layer 171 may be formed on the blocking pattern 111. The first sacrificial layer 171 may be formed by overgrowing the semiconductor layer 113'. For example, the first sacrificial layer 171 may be formed by overgrowing the semiconductor layer 113' and then planarizing the overgrown semiconductor layer 113'. The first sacrificial layer 171 may include the same material as the semiconductor layer 113'. In this case, the formation of the first sacrificial layer 171 may cause the opening 115 to be filled with the same material as the semiconductor layer 113'.

Figure 14:
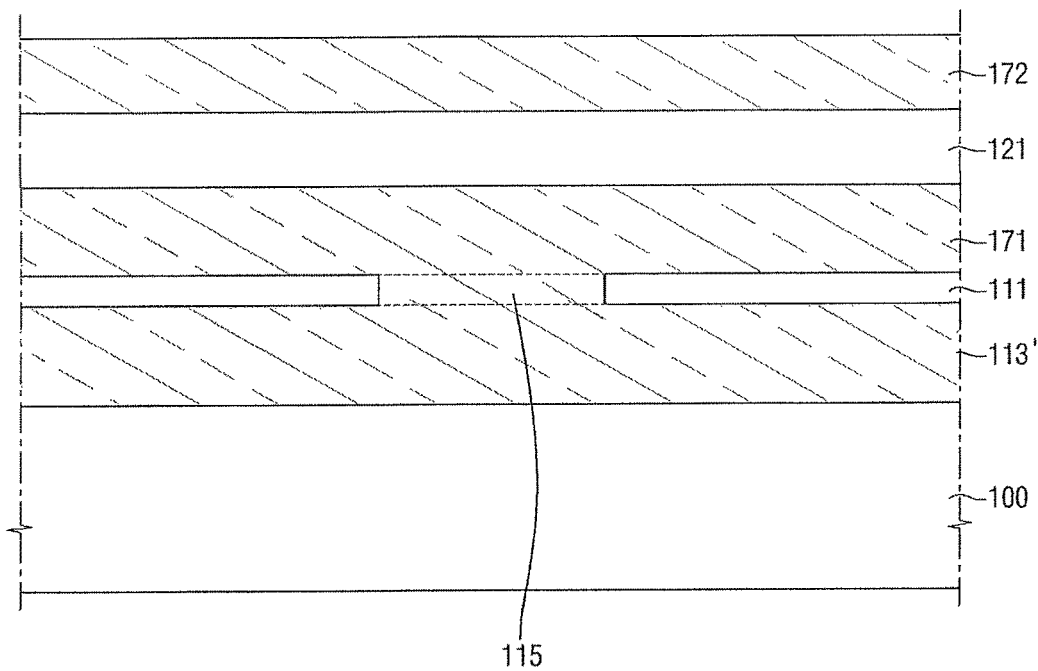

Referring to FIGS. 2 and 14, the first wire pattern 121 and a second sacrificial layer 172 may be stacked sequentially on the first sacrificial layer 171. In FIG. 14, two sacrificial layers are illustrated. However, this is merely for ease of description, and the present disclosure is not limited thereto. In the method of manufacturing a semiconductor device according to some embodiments of the present disclosure, one or more sacrificial layers can be stacked.

Figure 15:
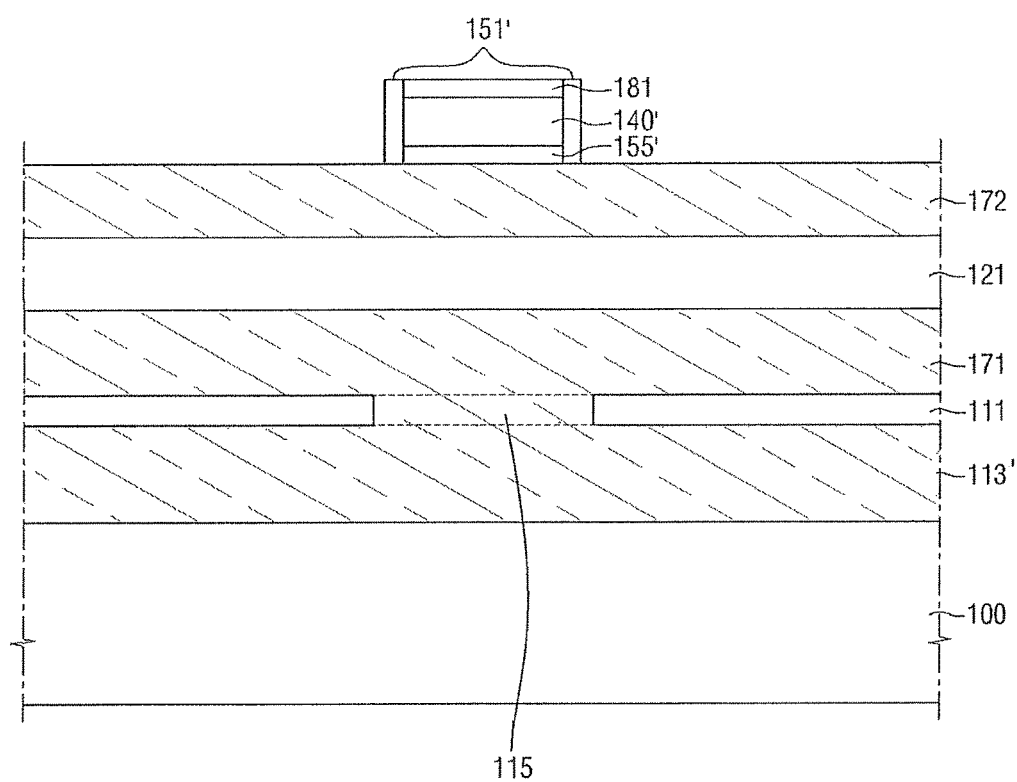

Referring to FIGS. 2 and 15, a dummy gate structure may be formed on the second sacrificial layer 172. The dummy gate structure may include a dummy interface layer 155', a dummy gate electrode 140', and a hard mask 181 stacked sequentially. That is, the dummy gate structure may be a stacked structure of the dummy interface layer 155', the dummy gate electrode 140', and the hard mask 181 extending along the first direction X1. The dummy gate structure may be formed using the hard mask 181 as an etch mask. The hard mask 181 may be formed on the dummy gate electrode 140'. The hard mask 181 may include, but not limited to, silicon nitride (SiN).

The dummy gate electrode 140' may be formed on the second sacrificial layer 172. The dummy gate electrode 140' may vertically overlap the opening 115 with respect to the top surface of the substrate 100. The dummy interface layer 155' may be formed between the dummy gate electrode 140' and the second sacrificial layer 172. Dummy gate spacers 151' may be formed on sidewalls of the dummy gate structure, respectively.

Figure 16:
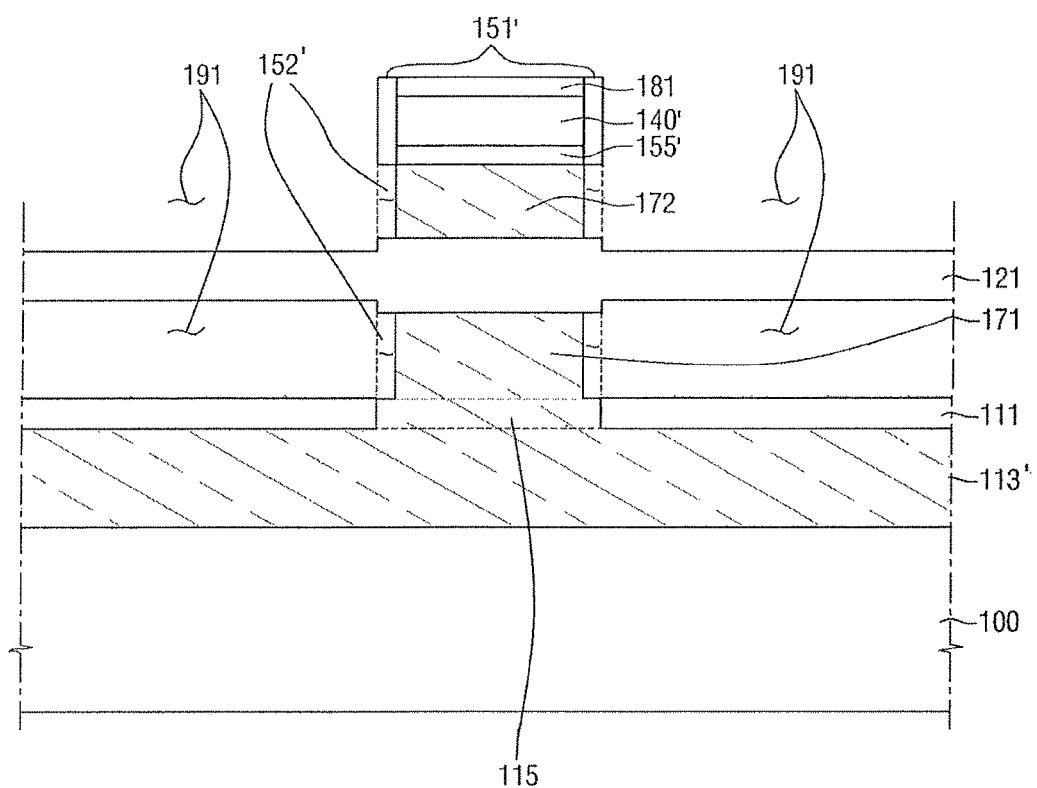

Referring to FIG. 16, the first sacrificial layer 171 and the second sacrificial layer 172 may be partially removed, thereby forming empty spaces 191. For example, parts of the first and second sacrificial layers 171 and 172 which perpendicularly, e.g., along the vertical direction, overlap the blocking pattern 111 with respect to the top surface of the substrate 100 may be removed. The removal process may be accomplished by a photolithography process or etching. However, the present disclosure is not limited thereto, and an appropriate process can be used.

Recesses 152' may be formed by further removing parts of the first and second sacrificial layers 171 and 172 remaining after the partial removal of the first sacrificial layer 171 and the second sacrificial layer 172. Here, a part of the first wire pattern 121 which perpendicularly, e.g., along the vertical direction, overlaps the blocking pattern 111 may also be etched. That is, a width of the part of the first wire pattern 121, which perpendicularly overlaps the blocking pattern 111, in a thickness direction may become smaller than that of a part of the first wire pattern 121, which perpendicularly overlaps the opening 115, in the thickness direction.

The recesses 152' may be formed by an etching process using hydrogen ($H_2$). However, the present disclosure is not limited thereto. For example, the recesses 152' may be formed by selectively etching the first sacrificial layer 171 and the second sacrificial layer 172.

Figure 17:
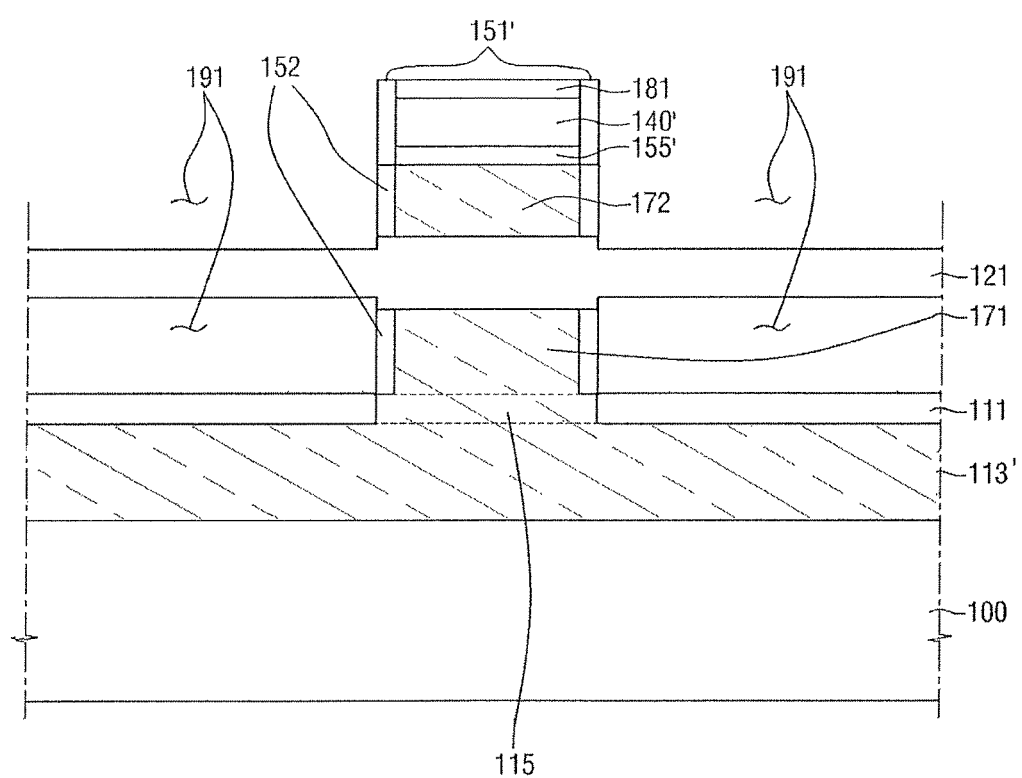

Referring to FIG. 17, second gate spacers 152 may be formed by filling the recesses 152'.

Figure 18:
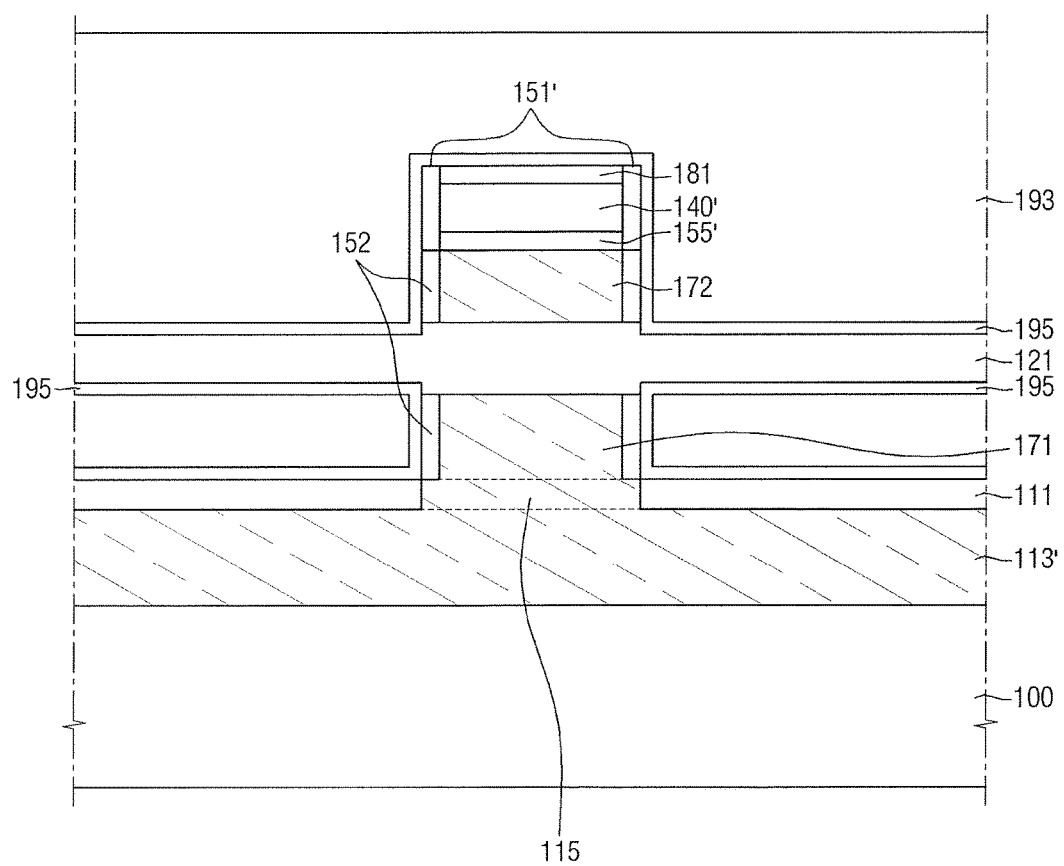

Referring to FIG. 18, a membrane material 195 may be formed on a top surface of the blocking pattern 111, on sidewalls of the second gate spacers 152, on sidewalls and top surfaces of the dummy gate spacers 151', and on a top surface of the dummy gate structure. In addition, the membrane material 195 may be formed around the part of the first wire pattern 121 which overlaps the blocking pattern 111.

A cap layer 193 may be formed to fill the empty spaces 191 after the formation of the membrane material 195. The cap layer 193 may also be formed on the membrane material 195 formed on the top surface of the dummy gate structure.

The cap layer 193 and the membrane material 195 may be formed using, e.g., chemical vapor deposition (CVD) or atomic layer deposition (ALD).

After the formation of the membrane material 195 and the cap layer 193, a doping process and an annealing process may be performed. The doping process may be, for example, a plasma doping (PLAD) process. The doping process and the annealing process may cause a part of the first wire pattern 121, on which the membrane material 195 is formed, to be defined as source/drain regions. That is, a second part 125 of the first wire pattern 121 may be defined as the source/drain regions. Here, the cap layer 193 prevents dopants from diffusing to other parts, thereby facilitating effective doping of the first wire pattern 121.

Figure 19:
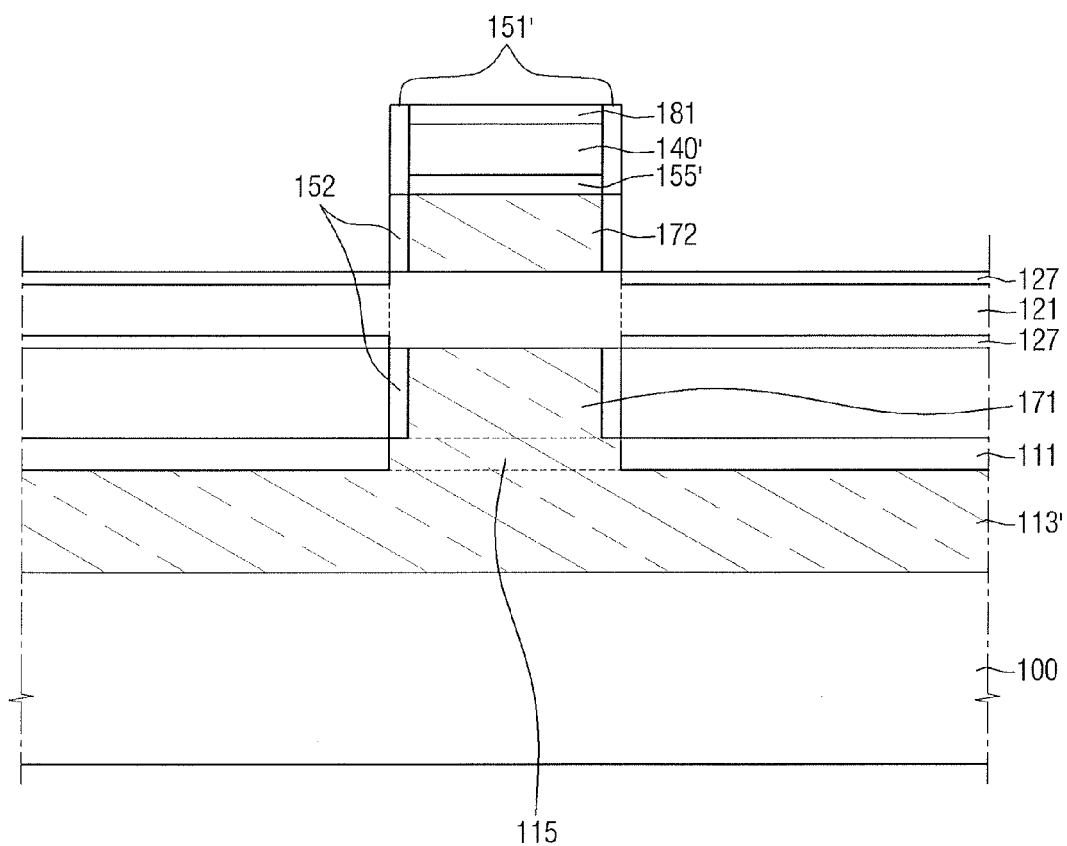

Referring to FIG. 19, after the doping process and the annealing process, the membrane material 195 and the cap layer 193 may be removed. A first epitaxial layer 127 may be formed on the part of the first wire pattern 121 which overlaps the blocking pattern 111, i.e., on the part of the first wire pattern 121 to become the second part 125 and is separated in FIG. 19 by a dashed line from the part of the first wire pattern 121 to become the first part 123. The first epitaxial layer 127 may be formed by an epitaxial process using a top surface and a bottom surface of the part of the first wire pattern 121 which overlaps the blocking pattern 111 as a seed.

Figure 20:
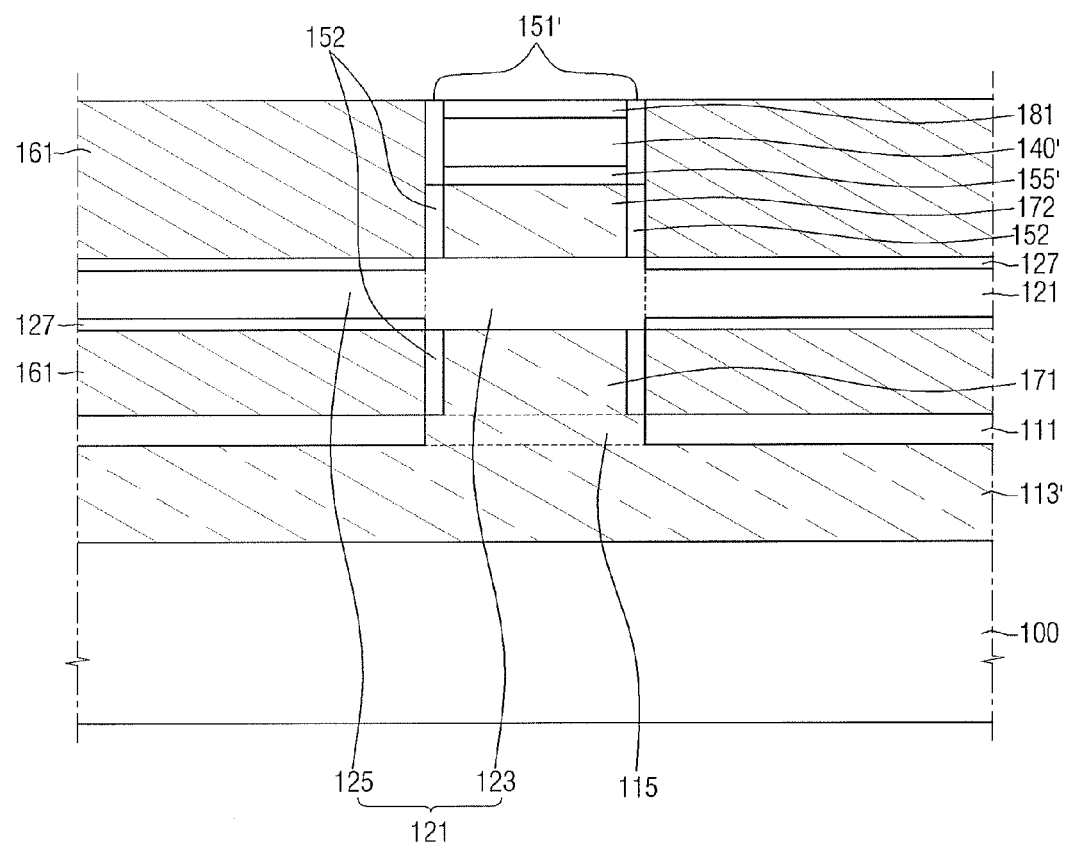

Referring to FIG. 20, the source/drain contact 161 may be formed by filling a space between the second part 125 of the first wire pattern 121 and the blocking pattern 111 and a space on the top surface of the second part 125 of the first wire pattern 121 with a contact material.

Figure 21:
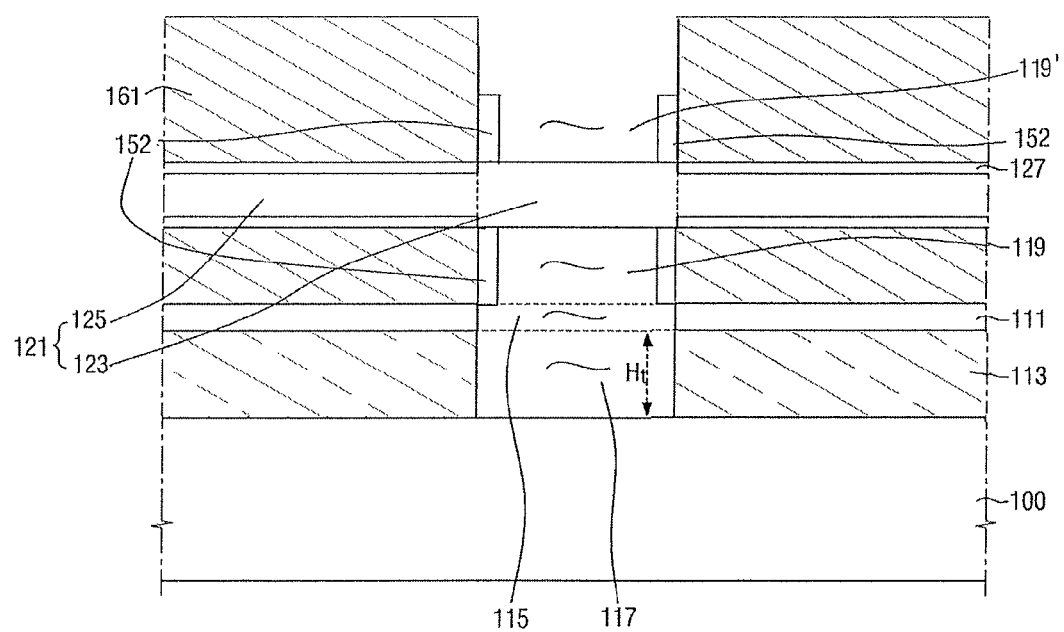

Referring to FIG. 21, the hard mask 181, the dummy gate electrode 140', the dummy interface layer 155', the dummy gate spacers 151', the second sacrificial layer 172, and the material that fills the opening 115 may be removed. Here, the second spacers 152 may not be removed. The removal process may be accomplished by, e.g., an etching process.

A trench 117 may be formed by removing the first sacrificial layer 171. That is, the semiconductor layer 113' may include the trench 117 formed along the opening 115. The trench 117 may be formed to a depth Ht equal to or smaller than a thickness of the semiconductor layer 113' in the thickness direction. The semiconductor pattern 113 may be formed by the formation of the trench 117 in the semiconductor layer 113'.

Referring to FIG. 2, the gate electrode 140 may be formed to partially fill a space 119' formed by the removal of the hard mask 181, the dummy gate electrode 140', the dummy interface layer 155', and the dummy gate spacers 151'. In addition, the gate electrode 140 may be formed to partially fill a space 119 formed by the removal of the second sacrificial layer 172. That is, in the embodiments of the present disclosure, the gate electrode 140 may be formed to surround a first part 123 of the first wire pattern 121.

In the embodiments of the present disclosure, the opening 115 may or may not be partially filled with the gate electrode 140. That is, the gate electrode 140 may be formed to overlap the opening 115.

In the embodiments of the present disclosure, the trench 117 may or may not be filled with part of the gate electrode 140. That is, the trench 117 may be filled with part of the gate electrode 140, with part of the gate electrode 140 and the semiconductor pattern 113, or with the semiconductor pattern 113 only. If a semiconductor device according to some embodiments of the present disclosure further includes the second wire pattern 122, the third part 123' of the second wire pattern 122 may be formed to overlap the opening 115.

Figure 22:
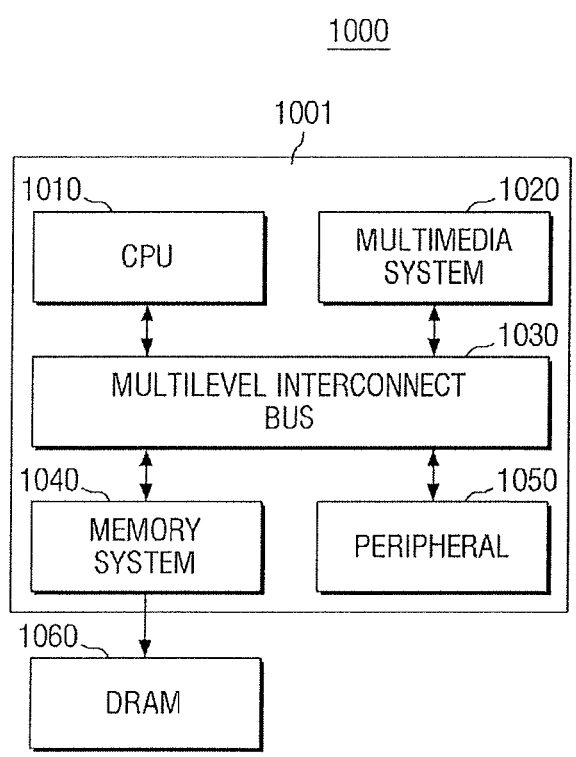
FIG. 22 illustrates a block diagram of a system-on-chip (SoC) including semiconductor devices according to some embodiments of the present disclosure.

FIG. 22 is a block diagram of a system-on-chip (SoC) 1000 including semiconductor devices according to some embodiments of the present disclosure.

Referring to FIG. 22, the SoC system 1000 may include an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC 1000. In some embodiments of the present disclosure, the CPU 1010 may be configured as a multi-core environment including a plurality of cores.

The multimedia system 1020 may be used to perform various multimedia functions in the SoC 1000. The multimedia system 1020 may include, e.g., a 3D engine module, a video codec, a display system, a camera system, and a post-processor.

The bus 1030 may be used for data communication among the CPU 1010, the multimedia system 1020, the memory system 1040 and the peripheral circuit 1050. In some embodiments of the present disclosure, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC 1000 to smoothly connect to an external device (e.g., mainboard). Accordingly, the peripheral circuit 1050 may include various interfaces that enable the external device connected to the SoC 1000 to be compatible with the SoC 1000.

The DRAM 1060 may function as a working memory needed for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may employ any one of the semiconductor devices according to some above-described embodiments of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a semiconductor pattern on the substrate along a first direction;
a blocking pattern on a top surface of the semiconductor pattern;
a first wire pattern on the blocking pattern along a second direction different from the first direction, the first wire pattern including a first part and a second part on opposite sides of the first part;
a gate electrode surrounding the first part of the first wire pattern; and
a contact surrounding the second part of the first wire pattern, a lower portion of the contact completely separating the second part of the first wire pattern from the blocking pattern,
wherein a height of a bottom surface of the contact from a top surface of the substrate is different from a height of a bottom surface of the gate electrode from the top surface of the substrate, and
wherein the contact is above the blocking pattern, the entire bottom surface of the contact being in direct contact with the blocking pattern.

2. The semiconductor device as claimed in claim 1, wherein the second part of the first wire pattern perpendicularly overlaps the blocking pattern.

3. The semiconductor device as claimed in claim 2, wherein the height of the bottom surface of the contact is higher than that of the bottom surface of the gate electrode.

4. The semiconductor device as claimed in claim 1, wherein the first part of the first wire pattern perpendicularly overlaps the blocking pattern.

5. The semiconductor device as claimed in claim 4, wherein the height of the bottom surface of the contact is lower than that of the bottom surface of the gate electrode.

6. The semiconductor device as claimed in claim 1, further comprising a spacer which between the gate electrode and the contact.

7. The semiconductor device as claimed in claim 1, further comprising a second wire pattern on the first wire pattern, the second wire pattern including a third part and a fourth part at opposite sides of the third part,
wherein the gate electrode surrounds the third part of the second wire pattern, and the contact surrounds the fourth part of the second wire pattern.

8. The semiconductor device as claimed in claim 1, wherein the semiconductor pattern includes a different material from the first wire pattern.

9. A semiconductor device, comprising:
a substrate;
a semiconductor pattern on the substrate;
a blocking pattern on the semiconductor pattern along a first direction, the blocking pattern including an opening;
a first wire pattern on the blocking pattern along a second direction different from the first direction, the first wire pattern including a first part and a second part on opposite sides of the first part;
a gate electrode surrounding the first part of the first wire pattern, the gate electrode overlapping the opening; and
a contact surrounding the second part of the first wire pattern on the blocking pattern, a lower portion of the contact completely separating the second part of the first wire pattern from the blocking pattern,
wherein a bottom surface of the contact and a bottom surface of the gate electrode overlap different portions of the substrate, the blocking pattern overlapping only a portion of the substrate overlapped by the bottom surface of the contact.

10. The semiconductor device as claimed in claim 9, wherein the semiconductor pattern includes a trench along the opening.

11. The semiconductor device as claimed in claim 10, wherein a part of the gate electrode fills the trench.

12. The semiconductor device as claimed in claim 10, wherein a depth of the trench is equal to or smaller than a thickness of the semiconductor pattern.

13. The semiconductor device as claimed in claim 9, further comprising a spacer between the gate electrode and the contact.

14. The semiconductor device as claimed in claim 9, further comprising an epitaxial layer surrounding the second part of the first wire pattern.

15. The semiconductor device as claimed in claim 9, wherein the semiconductor pattern includes a different material from the first wire pattern.

16. A semiconductor device, comprising:
- a substrate;
- a semiconductor pattern along a first direction;
- a blocking pattern on the semiconductor pattern;
- a gate electrode on the substrate along the first direction, the gate electrode being between portions of the semiconductor pattern;
- a contact on the blocking pattern; and
- a first wire pattern along a second direction different from the first direction, the first wire pattern extending through the gate electrode and through the contact, and a lower portion of the contact completely separating the first wire pattern from the blocking pattern, wherein a height of a bottom surface of the contact from a top surface of the substrate is different from a height of a bottom surface of the gate electrode from a top surface of the substrate, and wherein the contact is above the blocking pattern, the entire bottom surface of the contact being in direct contact with the blocking pattern.

17. The semiconductor device as claimed in claim 16, wherein the bottom surface of the contact and the bottom surface of the gate electrode overlap different portions of the substrate, the blocking pattern overlapping only a portion of the substrate overlapped by the bottom surface of the contact.

18. The semiconductor device as claimed in claim 16, wherein the first wire pattern includes a first part through the gate electrode, and a second part on opposite sides of the first part through the contact.

19. The semiconductor device as claimed in claim 18, wherein the second part of the first wire pattern overlaps the semiconductor pattern, the lower portion of the contact below the second part and an upper portion of the contact above the second part completely overlapping each other.

* * * * *